(12) United States Patent
Honjo et al.

(10) Patent No.: US 8,785,888 B2
(45) Date of Patent: Jul. 22, 2014

(54) APPARATUS FOR AND METHOD OF DRAWING

(71) Applicant: Dainippon Screen Mfg. Co., Ltd., Kyoto (JP)

(72) Inventors: Yoshinori Honjo, Kyoto (JP); Makoto Uesato, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 13/912,323

(22) Filed: Jun. 7, 2013

(65) Prior Publication Data

US 2014/0084184 A1      Mar. 27, 2014

(30) Foreign Application Priority Data

Sep. 27, 2012   (JP) ................................. 2012-213572

(51) Int. Cl.
*G21G 5/00*      (2006.01)
*H01L 21/268*    (2006.01)

(52) U.S. Cl.
CPC .................................. *H01L 21/268* (2013.01)
USPC ................. 250/492.2; 250/492.1; 250/492.22; 430/396; 430/397

(58) Field of Classification Search
USPC ................... 250/492.1–492.22; 430/396, 397
See application file for complete search history.

(56) References Cited

FOREIGN PATENT DOCUMENTS

| JP | 2008-129248 | 6/2008 |
|---|---|---|
| JP | 2009-237917 | * 10/2008 |
| JP | 2009-237917 | 10/2009 |
| JP | 2011-081204 | 4/2011 |

* cited by examiner

*Primary Examiner* — Michael Maskell
(74) *Attorney, Agent, or Firm* — Ostrolenk Faber LLP

(57) ABSTRACT

A drawing apparatus accepts a selection manipulation for selecting the type of shape of a light outgoing ratio function defining a relationship between the position of modulation units included in an optical unit as seen in the direction of the arrangement of the modulation units and a light outgoing ratio from among a plurality of shape type candidates. The drawing apparatus then adjusts the light outgoing ratio of each of the modulation units in accordance with the accepted shape type. While emitting a beam of drawing light of a strip-shaped cross-sectional configuration from the optical unit, the drawing apparatus moves the optical unit relative to a substrate in a direction orthogonal to the direction of the longer dimension of the strip-shaped cross section of the drawing light beam to perform a drawing process on the substrate.

7 Claims, 18 Drawing Sheets

F I G. 3
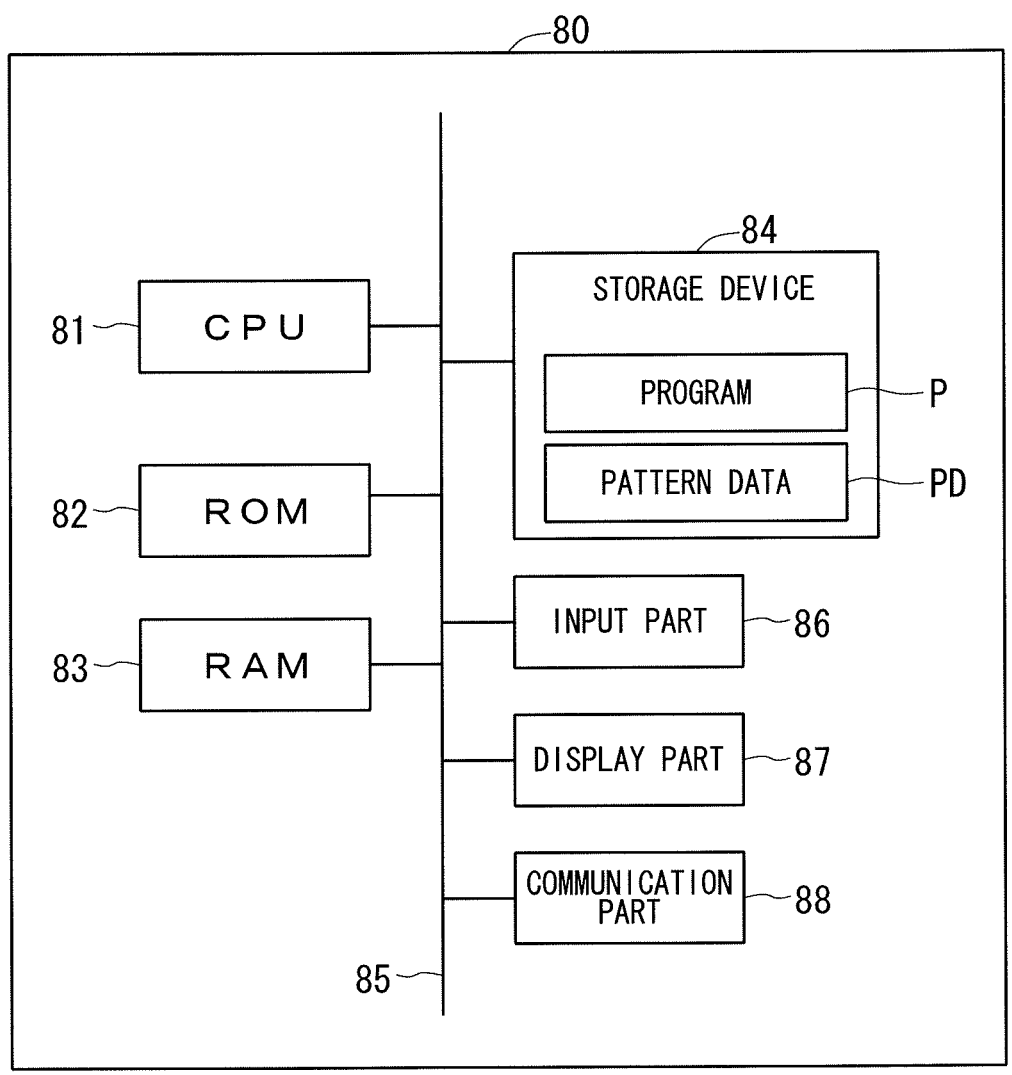

F I G. 1 5
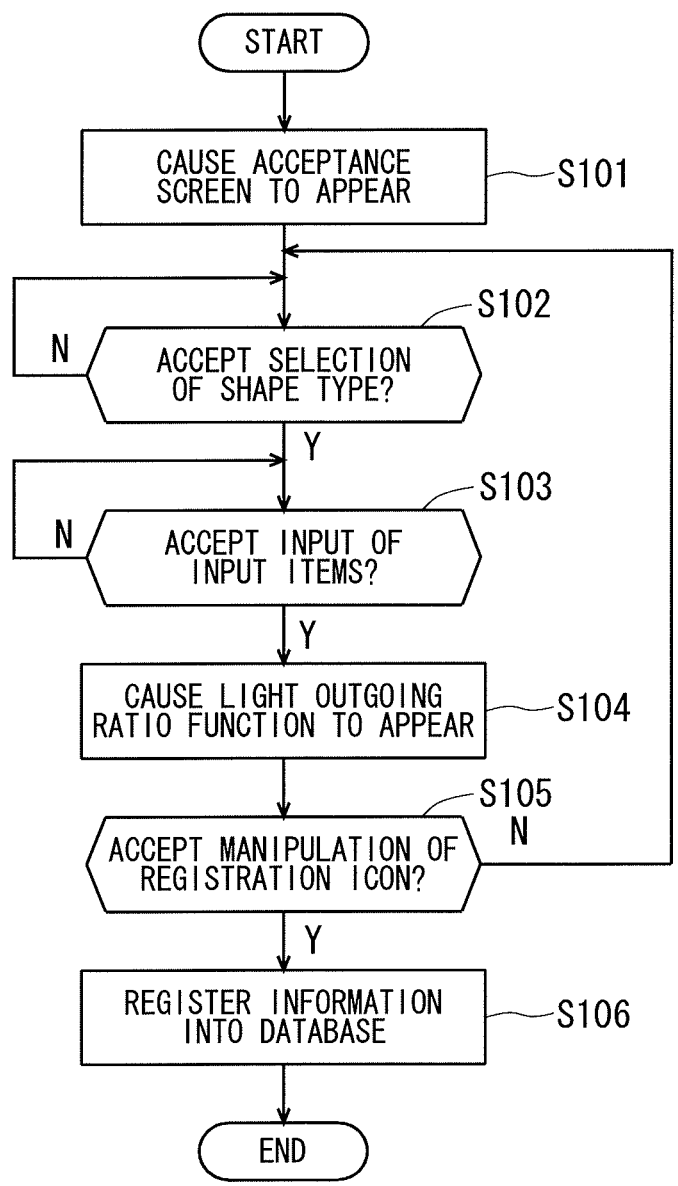

F I G. 1 6
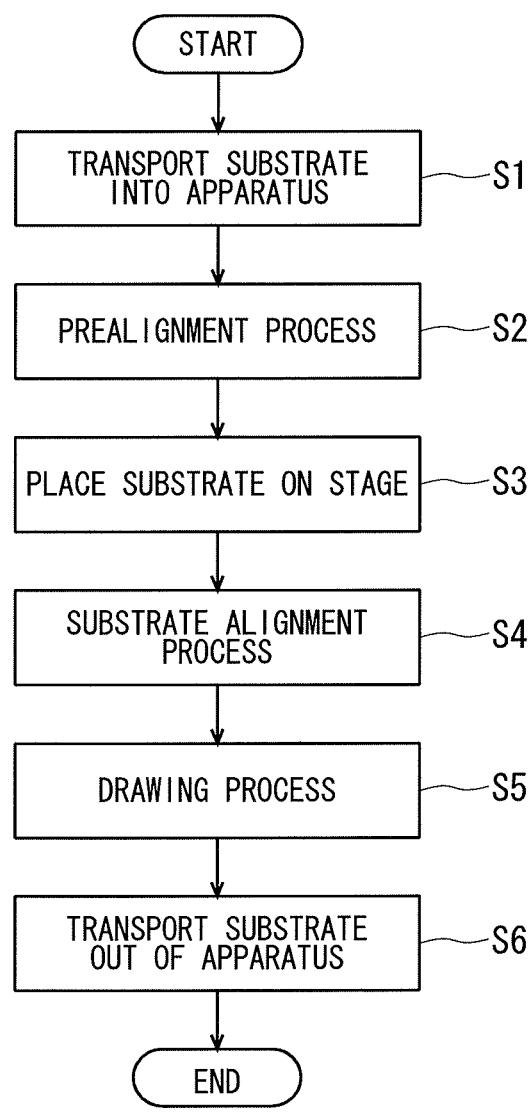

APPARATUS FOR AND METHOD OF DRAWING

BACKGROUND OF THE INVENTION

1. Field of the Invention

The present invention relates to a technique for directing light onto various substrates including a semiconductor substrate, a printed circuit board, a substrate for a color filter provided in a liquid crystal display device and the like, a glass substrate for a flat panel display provided in a liquid crystal display device, a plasma display device and the like, a substrate for a magnetic disk, a substrate for an optical disk, a solar cell panel and the like (hereinafter referred to simply as "substrates") to draw patterns on the substrates.

2. Description of the Background Art

For the process of exposing a photosensitive material applied onto a substrate to light to form a circuit pattern and the like, attention has been given in recent years to an exposure apparatus (what is called a drawing apparatus) which does not use a mask but scans the photosensitive material applied onto the substrate with light (a beam of drawing light) modulated in accordance with data including descriptions of the pattern to directly expose the photosensitive material with the light, thereby forming the pattern. The drawing apparatus includes an optical head having, for example, a spatial light modulator for modulating a light beam on and off on a pixel-by-pixel basis (e.g., a reflective spatial modulator which uses a control signal to switch between an on state in which a light beam supplied from a light source is reflected onto a substrate and an off state in which a light beam is reflected in a direction different from that in the on state on a pixel-by-pixel basis). The drawing apparatus directs a drawing light beam from the optical head onto a substrate moved relative to the optical head to expose the substrate to the drawing light beam, thereby forming a pattern (or to draw a pattern on the substrate), as disclosed in Japanese Patent Application Laid-Open No. 2009-237917, for example.

While emitting the drawing light beam, for example, of a strip-shaped cross-sectional configuration, the optical head in the drawing apparatus moves relative to the substrate along an axis (main scanning axis) orthogonal to the direction of the longer dimension of the strip-shaped cross section of the drawing light beam (which is referred to as a main scanning process). This main scanning process causes the exposure to light to form a pattern corresponding to a single strip-shaped region extending along the main scanning axis on the substrate. Upon completion of the main scanning process involving the emission of the drawing light beam, the optical head subsequently moves relative to the substrate along a sub-scanning axis orthogonal to the main scanning axis, and then performs a main scanning process involving the emission of the drawing light beam again. This causes the exposure to light to form a pattern corresponding to a strip-shaped region adjacent to the strip-shaped region subjected to the pattern exposure by the preceding main scanning process. In this manner, the main scanning process involving the emission of the drawing light beam is performed repeatedly, with the sub-scanning process performed between adjacent main scanning processes, whereby the entire region of the substrate is subjected to the pattern exposure.

In the process of exposing a substrate to light to form a pattern by the aforementioned method, there has been a problem such that nonuniformity of light exposure is prone to occur in boundary sections between the strip-shaped regions. There is a possibility that the nonuniformity of light exposure in the boundary sections causes discontinuity of the pattern (e.g., a break in the pattern, and the increase and decrease in the thickness of the pattern) in the boundary sections and the like. The discontinuity of the pattern might exert adverse effects on the electrical characteristics (current-carrying characteristics) of finished products.

To solve such a problem, Japanese Patent Application Laid-Open No. 2008-129248 discloses a technique in which the distance of movement in the sub-scanning direction is made shorter than the longer dimension of the strip-shaped cross section of the light beam emitted from the optical head, so that the boundary sections of the strip-shaped regions overlap each other. This configuration causes the influences of the nonuniform characteristics of the optical head to be mixed and made uniform, thereby reducing the nonuniformity of light exposure in the boundary sections between the strip-shaped regions.

The use of the technique disclosed in Japanese Patent Application Laid-Open No. 2008-129248 reduces the non-uniformity of light exposure in the boundary sections between the strip-shaped regions to some extent. However, how the nonuniformity of light exposure appears in the boundary sections between the strip-shaped regions varies significantly depending on processing conditions.

Specifically, the boundary sections are sections in which regions irradiated with light at different times are adjacent to each other (or overlap each other). For this reason, how the nonuniformity of light exposure appears in the boundary sections varies, for example, with changes in the type of a photosensitive material, in optical diffusion characteristics and the like. As the speed of movement of the optical head relative to the substrate, for example, is varied, a difference in timing of the irradiation of the boundary sections with light is varied, so that how the nonuniformity of light exposure appears is accordingly varied.

There is hence a great likelihood that even a slight change in processing conditions causes the nonuniformity of light exposure in the boundary sections to occur although appropriate adjustments are made under certain processing conditions so that the nonuniformity of light exposure in the boundary sections does not occur. Thus, a change in processing conditions requires an immediate adjustment to be made again. However, this adjustment is not easily made conventionally. The conventional techniques cannot flexibly respond to changes in processing conditions to have difficulties in sufficiently ensuring the uniformity of light exposure.

SUMMARY OF THE INVENTION

The present invention is intended for a drawing apparatus for directing light onto a substrate with a photosensitive material formed thereon to draw a pattern on the substrate. According to the present invention, the drawing apparatus comprises: an optical unit moving relative to the substrate in a first direction while emitting a beam of drawing light of a strip-shaped cross-sectional configuration, the first direction being orthogonal to a second direction which is the direction of the longer dimension of the strip-shaped cross section of the drawing light beam; and an adjustment part for adjusting a distribution of the amount of drawing light as seen in the second direction, the optical unit including a light source part for emitting a beam of light of a strip-shaped cross-sectional configuration, and a spatial light modulation part including a plurality of modulation units arranged in a line, the spatial light modulation part causing the light beam emitted from the light source part to enter the modulation units in such a manner that the longer dimension of the strip-shaped cross section of the light beam is along the arrangement of the modulation units, the spatial light modulation part causing the modulation units to modulate the incident light beam, thereby forming the drawing light beam, the adjustment part including an acceptance part for accepting a selection manipulation for selecting the type of shape of a light outgoing ratio function from among a plurality of shape type candidates, the light outgoing ratio function being a function defining a relationship between the position of the modulation units as seen in the direction of the arrangement of the modulation units and a light outgoing ratio, the light outgoing ratio being a ratio of the amount of outgoing light to the amount of light incident on the modulation units, and a light outgoing ratio adjustment part for adjusting the light outgoing ratio of each of the modulation units in accordance with the shape type accepted by the acceptance part.

According to the present invention, the simple selection manipulation for selecting the shape type of the light outgoing ratio function from among the plurality of shape type candidates achieves the adjustment of the light outgoing ratio of each of the modulation units, to achieve the adjustment of the light amount distribution of the strip-shaped drawing light beam entering the substrate as seen in the second direction. Thus, the adjustment for reducing the nonuniformity of light exposure in a boundary section is made easily.

Preferably, the shape type candidates include a stepped type, and the stepped type includes a mid-portion where the light outgoing ratio is constant, and a changed portion where the light outgoing ratio is changed in stepped form, the changed portion being continuous with the mid-portion.

The stepped type is included in the shape type candidates. For example, when the nonuniformity of light exposure occurs in such a manner that the amount of light exposure is varied relatively greatly in a relatively small area in the boundary section, the selection of the stepped type as the shape type of the light outgoing ratio function effectively reduces the nonuniformity of light exposure.

Preferably, the acceptance part accepts the specification of the width of the changed portion when the stepped type is selected.

Preferably, the acceptance part accepts the specification of the light outgoing ratio of the changed portion when the stepped type is selected.

Preferably, the shape type candidates include a trapezoidal type, and the trapezoidal type includes a mid-portion where the light outgoing ratio is constant, and a changed portion where the light outgoing ratio is changed in inclined form, the changed portion being continuous with the mid-portion.

The trapezoidal type is included in the shape type candidates. For example, when the nonuniformity of light exposure occurs in such a manner that the amount of light exposure is varied relatively gradually in a relatively large area in the boundary section, the selection of the trapezoidal type as the shape type of the light outgoing ratio function effectively reduces the nonuniformity of light exposure.

Preferably, the acceptance part accepts the specification of the light outgoing ratio in one or each representative position within the changed portion when the trapezoidal type is selected.

Preferably, the acceptance part causes an acceptance screen displaying the shape type candidates in list form to appear on a determined display device, and accepts the selection manipulation via the acceptance screen.

The acceptance screen displaying the shape type candidates in list form appears, and the selection manipulation is accepted via the acceptance screen. This allows an operator to especially easily perform the selection manipulation for selecting any one of the shape type candidates.

Preferably, the adjustment part further includes a registration part for registering information accepted by the acceptance part in association with a processing condition of a process of drawing a pattern on the substrate.

The information accepted from an operator is registered in association with the processing condition. Thus, the operator need not perform the input manipulation again for the same processing condition, but the light amount distribution of the strip-shaped drawing light beam entering the substrate as seen in the second direction is adjusted to an appropriate shape which reduces the nonuniformity of light exposure in the boundary section.

The present invention is also intended for a method of directing light onto a substrate with a photosensitive material formed thereon to draw a pattern on the substrate.

It is therefore an object of the present invention to provide a technique capable of easily making an adjustment to reduce the nonuniformity of light exposure in a boundary section.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a block diagram showing a hardware configuration of a controller;
FIG. 15 is a flow diagram showing a procedure related to the registration of the shape of the light outgoing ratio function;
FIG. 16 is a flow diagram showing a procedure performed in the drawing apparatus.

DESCRIPTION OF THE PREFERRED EMBODIMENTS

Figure 1:
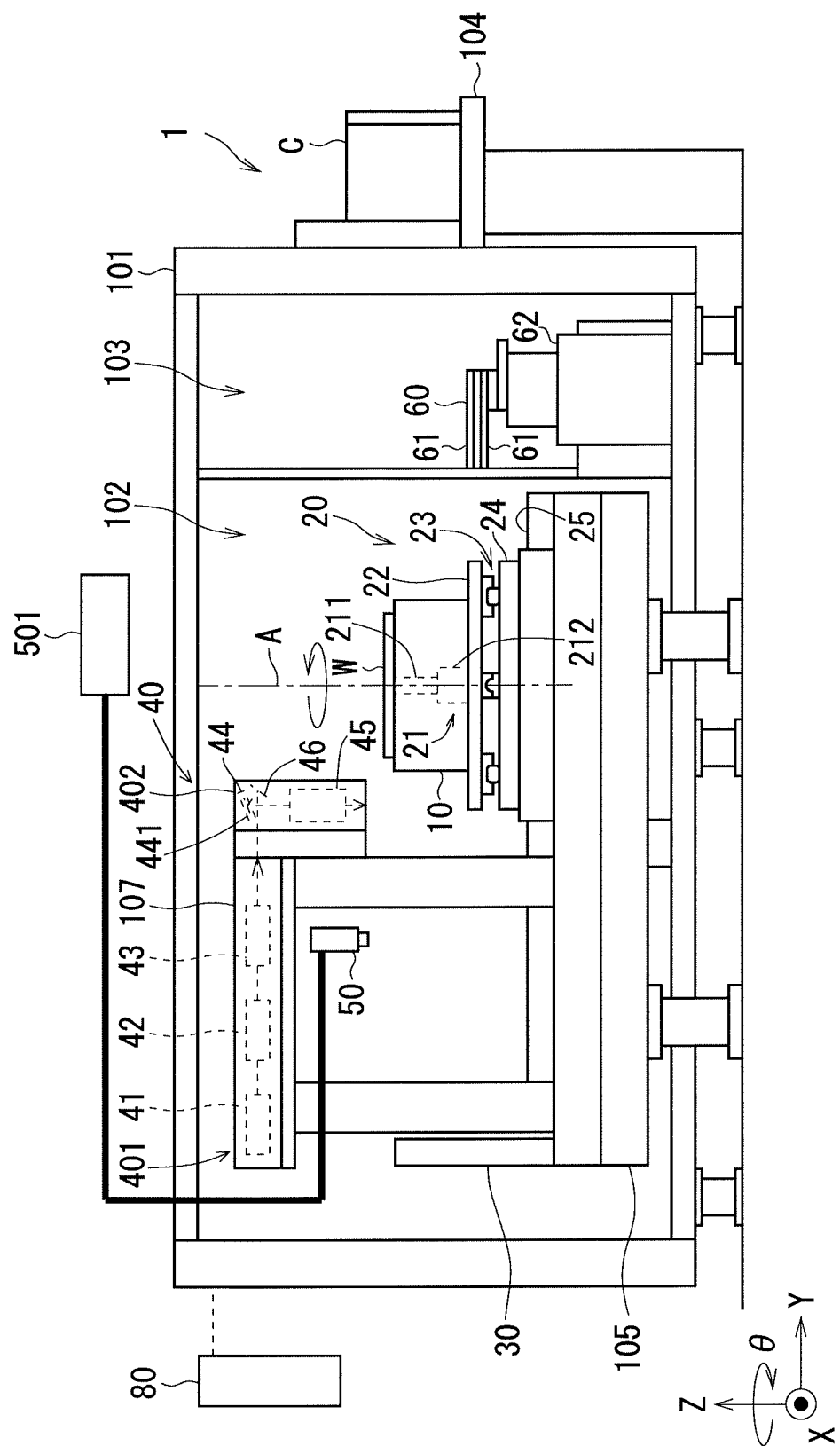
FIG. 1 is a side view of a drawing apparatus.

A preferred embodiment according to the present invention will now be described with reference to the drawings. The preferred embodiment to be described below is merely an example embodying the present invention, and is not an instance which limits the technical scope of the present invention. In the drawings, the dimensions of components and the number of components are shown in exaggeration or in simplified form in some cases for the sake of easier understanding.

<1. Apparatus Configuration>

Figure 2:
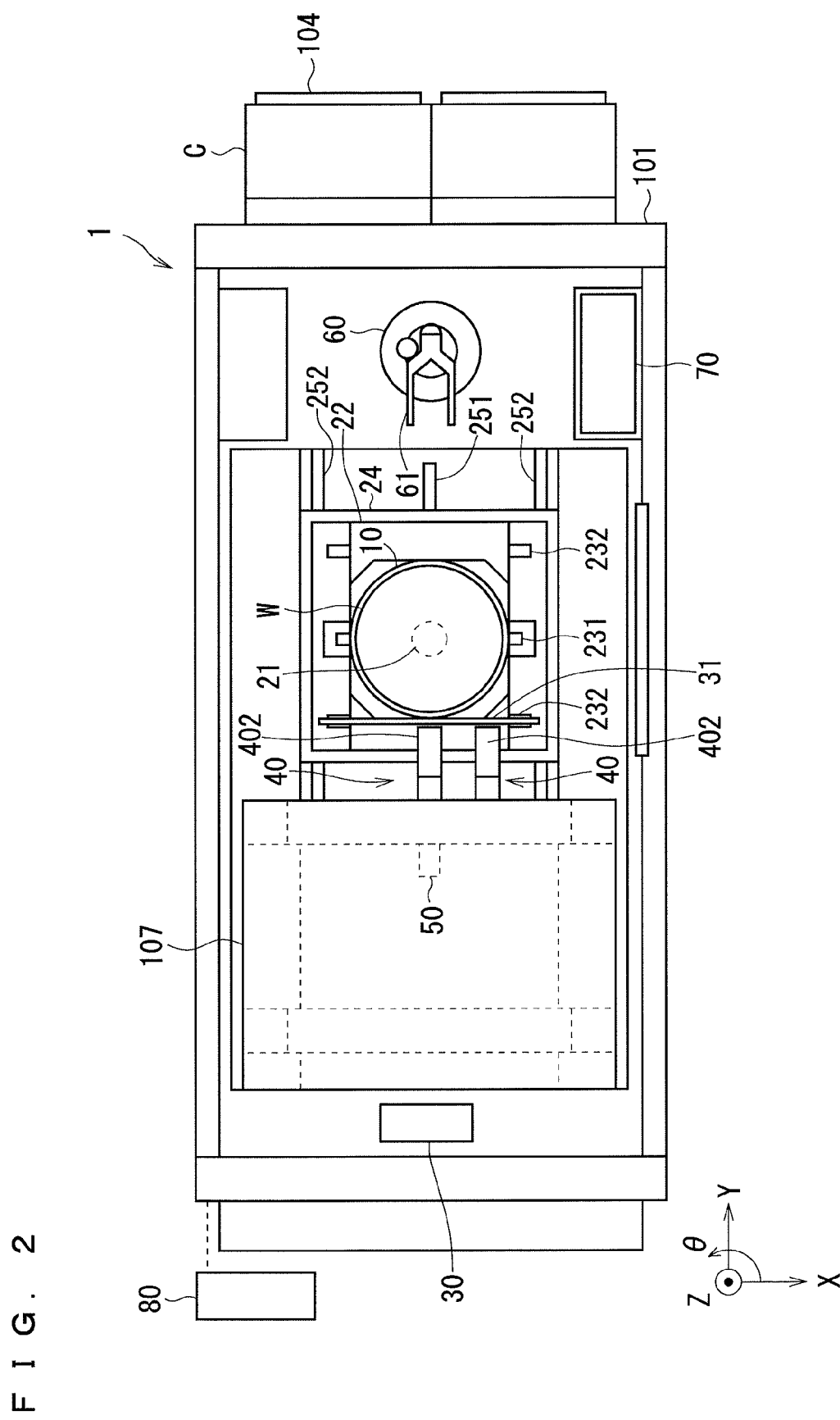
FIG. 2 is a plan view of the drawing apparatus.

The configuration of a drawing apparatus 1 according to the preferred embodiment of the present invention will be described with reference to FIGS. 1 and 2. FIG. 1 is a side view schematically showing the configuration of the drawing apparatus 1. FIG. 2 is a plan view schematically showing the configuration of the drawing apparatus 1.

The drawing apparatus 1 is an apparatus for directing light (a beam of drawing light) modulated in accordance with CAD data and the like onto an upper surface of a substrate W with a layer of a photosensitive material such as a resist formed thereon to expose the layer to the light, thereby forming a pattern (e.g., a circuit pattern) (or to draw a pattern). The substrate W may be any one selected from among various substrates including a semiconductor substrate, a printed circuit board, a substrate for a color filter provided in a liquid crystal display device and the like, a glass substrate for a flat panel display provided in a liquid crystal display device, a plasma display device and the like, a substrate for a magnetic disk, a substrate for an optical disk, a solar cell panel and the like, for example. In FIGS. 1 and 2, a circular semiconductor substrate is shown as the substrate W.

The drawing apparatus 1 is configured such that various components are disposed in a body interior defined by mounting cover panels (not shown) to a ceiling surface and a peripheral surface of a framework constituted by a body frame 101 and on a body exterior which is the outside of the body frame 101.

The body interior of the drawing apparatus 1 is separated into a processing region 102 and a transfer region 103. A stage 10 for holding a substrate W thereon, a stage drive mechanism 20 for moving the stage 10, a stage position measuring part 30 for measuring the position of the stage 10, two optical units 40 for directing light onto the upper surface of the substrate W, and an imaging part 50 for imaging an alignment mark on the substrate W are mainly disposed in the processing region 102. On the other hand, a transport device 60 for transporting a substrate W into and out of the processing region 102, and a prealignment part 70 are disposed in the transfer region 103. The drawing apparatus 1 further includes a controller 80 electrically connected to the components of the drawing apparatus 1 and for controlling the operations of the respective components. The configuration of the components of the drawing apparatus 1 will be described below.

<Stage 10>

The stage 10 is a holder having a planar outside shape and for holding a circular substrate W placed on the upper surface thereof in a horizontal attitude. The upper surface of the stage 10 has a plurality of suction holes (not shown) formed therein. The stage 10 is capable of fixing and holding the substrate W placed thereon on the upper surface of the stage 10 by producing a negative pressure (suction pressure) in the suction holes.

<Stage Drive Mechanism 20>

The stage drive mechanism 20 is a mechanism for moving the stage 10 relative to a base 105. The stage drive mechanism 20 moves the stage 10 in a main scanning direction (in a Y-axis direction), a sub-scanning direction (in an X-axis direction), and a rotational direction (in a rotational direction about a Z-axis (in a θ-axis direction)). Specifically, the stage drive mechanism 20 includes a rotational mechanism 21 for rotating the stage 10, a support plate 22 for supporting the stage 10 via the rotational mechanism 21, and a sub-scanning mechanism 23 for moving the support plate 22 in the sub-scanning direction. The stage drive mechanism 20 further includes a base plate 24 for supporting the support plate 22 via the sub-scanning mechanism 23, and a main scanning mechanism 25 for moving the base plate 24 in the main scanning direction.

The rotational mechanism 21 rotates the stage 10 about a rotational axis A passing through the center of the upper surface (the surface for placement of a substrate W thereon) of the stage 10 and perpendicular to the surface for placement. The rotational mechanism 21 may be configured to include, for example, a rotary shaft 211 having an upper end secured to the back surface opposite from the surface for placement and extending along a vertical axis, and a rotation drive part 212 (for example, a rotary motor) provided on a lower end of the rotary shaft 211 and for rotating the rotary shaft 211. In such a configuration, the rotation drive part 212 rotates the rotary shaft 211, whereby the stage 10 is rotated about the rotational axis A in a horizontal plane.

The sub-scanning mechanism 23 includes a linear motor 231 comprised of a moving element mounted to the lower surface of the support plate 22 and a stator laid on the upper surface of the base plate 24. Also, a pair of guide members 232 extending in the sub-scanning direction are laid on the base plate 24. A ball bearing slidably movable along each of the guide members 232 is provided between each of the guide members 232 and the support plate 22. In other words, the support plate 22 is supported on the pair of guide members 232 via the ball bearings. In such a configuration, when the linear motor 231 is put in operation, the support plate 22 smoothly moves in the sub-scanning direction while being guided by the guide members 232.

The main scanning mechanism 25 includes a linear motor 251 comprised of a moving element mounted to the lower surface of the base plate 24 and a stator laid on the base 105 of the drawing apparatus 1. Also, a pair of guide members 252 extending in the main scanning direction are laid on the base 105. An air bearing, for example, is provided between each of the guide members 252 and the base plate 24. Air is always supplied from a utility facility to the air bearings, and the base plate 24 is floatingly supported by the air bearings in a non-contacting manner over the guide members 252. In such a configuration, when the linear motor 251 is put in operation, the base plate 24 smoothly moves in the main scanning direction without friction while being guided by the guide members 252.

<Stage Position Measuring Part 30>

The stage position measuring part 30 is a mechanism for measuring the position of the stage 10. Specifically, the stage position measuring part 30 is constructed by an interference-type laser length measuring machine which emits laser light from outside the stage 10 toward a plane mirror 31 mounted to a side surface on the negative Y side of the stage 10 and receives the light reflected therefrom to measure the position (specifically, the Y-position as measured in the main scanning direction and the θ-position as measured in the rotational direction) of the stage 10, based on interference between the reflected light and the emitted light.

<Optical Units 40>

The optical units 40 are mechanisms for directing the drawing light onto the upper surface of a substrate W held on the stage 10 to draw a pattern on the substrate W. As mentioned above, the drawing apparatus 1 includes the two optical units 40. As an example, one of the optical units 40 is responsible for the exposure of one half of the substrate W on the positive X side to light, and the other optical unit 40 is responsible for the exposure of the other half of the substrate W on the negative X side to light. The two optical units 40 are disposed in a spaced apart relationship in the sub-scanning direction (X-axis direction) and fixed to a support frame 107 provided over the base 105 so as to extend over the stage 10 and the stage drive mechanism 20. It should be noted that the two optical units 40 need not necessarily be spaced a fixed distance apart from each other, but a mechanism capable of changing the position of one or both of the optical units 40 may be provided to make the distance between the optical units 40 adjustable. The number of optical units 40 need not always be two, but may be one or not less than three.

The two optical units 40 are identical in configuration with each other. Specifically, each of the optical units 40 includes a light source part 401 disposed inside a box forming a top, and a head part 402 accommodated inside an annexed box mounted to the positive Y side of the support frame 107. The light source part 401 mainly includes a laser drive part 41, a laser oscillator 42, and an illumination optical system 43. The head part 402 mainly includes a spatial light modulation unit 44, and a projection optical system 45.

The laser oscillator 42 is driven by the laser drive part 41 to emit laser light from an output mirror (not shown). The illumination optical system 43 changes the light (a spot beam) emitted from the laser oscillator 42 into linear light (a line beam having a strip-shaped cross-sectional configuration) having a uniform intensity distribution. The light emitted from the laser oscillator 42 and changed into the line beam in the illumination optical system 43 enters the head part 402. Each of the optical units 40 may be configured such that an aperture is used to narrow down the light emitted from the laser oscillator 42 before the light enters the head part 402, thereby adjusting the amount of light entering the head part 402.

The light entering the head part 402 is subjected to a spatial modulation in accordance with pattern data PD. The resultant light impinges on the substrate W. It should be noted that the spatial modulation of light specifically means the process of changing a spatial distribution (amplitude, phase, polarization and the like) of the light. The "pattern data PD" refers to data such that positional information on the substrate W to be irradiated with light is recorded on a pixel-by-pixel basis, and is generated, for example, by rasterizing design data about a pattern generated using CAD (computer aided design). The pattern data PD is acquired, for example, by receiving the pattern data PD from an external terminal device connected through a network and the like or by reading the pattern data PD from a storage medium. The acquired pattern data PD is stored in a storage device 84 in the controller 80 (with reference to FIG. 3).

The light entering the head part 402 specifically travels via a mirror 46 into the spatial light modulation unit 44 at a determined angle. The spatial light modulation unit 44 includes a spatial light modulator 441 for performing the spatial modulation on the incident light by electrical control to reflect necessary light which contributes to the pattern drawing and unnecessary light which does not contribute to the pattern drawing in respective directions different from each other. The spatial light modulator 441 is constructed using, for example, a spatial modulator of a diffraction grating type in which fixed and movable ribbons serving as modulation elements are disposed one-dimensionally (e.g., a GLV (grating light valve). "GLV" is a registered trademark) and the like. The spatial modulator of a diffraction grating type includes a diffraction grating with a variable depth, and is manufactured, for example, using a semiconductor device manufacturing technique.

An example of the configuration of the spatial light modulator 441 will be described more specifically. The spatial light modulator 441 is configured to include a plurality of modulation units 442 arranged one-dimensionally (with reference to FIG. 5). The operation of each of the modulation units 442 is controlled, for example, by whether a voltage is applied thereto or not. The spatial light modulator 441 includes a driver circuit unit (not shown) capable of independently applying voltages to the modulation units 442, respectively. This makes the voltages for the respective modulation units 442 independently switchable.

When each of the modulation units 442 is in a first voltage state (e.g., a state in which no voltage is applied thereto), the surface of each modulation unit 442 is a flat surface, for example. When light enters each modulation unit 442 with the flat surface, the incident light is regularly reflected without being diffracted. This produces a regularly reflected light (zero-order diffracted light). This regularly reflected light serving as the necessary light which contributes to the pattern drawing is guided via the projection optical system 45 to be described later to the surface of the substrate W. On the other hand, when each of the modulation units 442 is in a second voltage state (e.g., a state in which a voltage is applied thereto), one or more parallel grooves having a determined depth (maximum depth) and arranged at regular intervals are formed in the surface of each modulation unit 442. When light enters each modulation unit 442 in this state, beams of regularly reflected light (zero-order diffracted light) cancel each other out to disappear, so that diffracted light of other orders (plus and minus first-order (±1st-order) diffracted light, plus and minus second-order (±2nd-order) diffracted light, and higher-order diffracted light) is produced. The diffracted light of other than zero-order serving as the unnecessary light which does not contribute to the pattern drawing is intercepted by the projection optical system 45 to be described later and hence does not reach the substrate W. The first voltage state of each of the modulation units 442 is also referred to as an "on state," and the second voltage state thereof is also referred to as an "off state."

Figure 11:
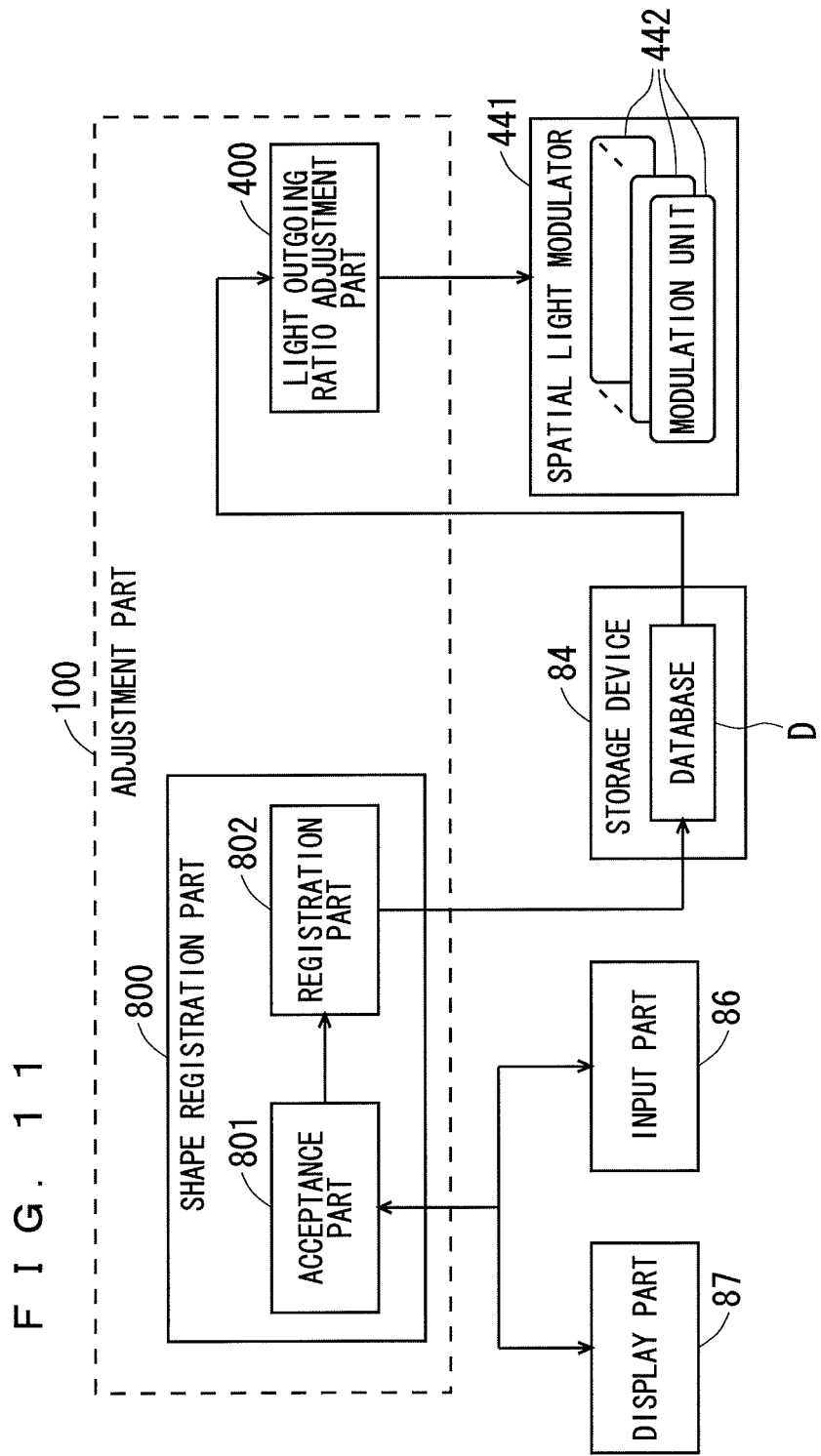
FIG. 11 is a block diagram showing a configuration related to a shape registration part.

The spatial light modulator 441 is connected to a mechanism (light outgoing ratio adjustment part) 400 for individually adjusting the on-state light outgoing ratio of each of the group of modulation units 442 provided therein (with reference to FIG. 11). The term "light outgoing ratio" of each modulation unit 442 used herein refers to a ratio of the amount of outgoing light to the amount of incoming light (the amount of outgoing light divided by the amount of incoming light). The term "amount of outgoing light" used herein refers to the amount of necessary light (i.e., light emitted in such a direction as to reach the substrate W), and refers to the amount of regularly reflected light (zero-order diffracted light). The light outgoing ratio of each modulation unit 442 is 100% when the surface of each modulation unit 442 is a flat surface. The light outgoing ratio decreases when the grooves are formed in the surface of each modulation unit 442. The deeper the grooves are, the smaller the light outgoing ratio is. The light outgoing ratio adjustment part 400 adjusts the depth of the grooves formed in the surface of each modulation unit 442 in the on state in the range of zero to the aforementioned maximum depth (which is equal to the depth of the grooves formed in the surface of each modulation unit 442 in the off state and which provides a light outgoing ratio of 0%) to thereby adjust the light outgoing ratio of each modulation unit 442 in the on state to any value in the range of 0 to 100%.

The projection optical system 45 intercepts the unnecessary light included in the light incoming from the spatial light modulator 441, and guides only the necessary light included in the light incoming from the spatial light modulator 441 to the upper surface of the substrate W to form an image on the upper surface of the substrate W. Specifically, the necessary light emitted from the spatial light modulator 441 travels in a negative Z direction along the Z-axis, and the unnecessary light emitted from the spatial light modulator 441 travels in the negative Z direction along axes slightly inclined in positive and negative X directions from the Z-axis. The projection optical system 45 includes, for example, a shield plate having a through hole formed in the center thereof so as to allow only the necessary light to pass therethrough, and intercepts the unnecessary light by means of the shield plate. The projection optical system 45 may be configured to further include a plurality of lenses constituting a zoom part for increasing (or decreasing) the width of the necessary light, an objective lens for image-forming the necessary light with a determined magnification on the substrate W, and the like, in addition to the shield plate.

To cause the optical units 40 to perform a drawing operation, the controller 80 drives the laser drive part 41 to cause the laser oscillator 42 to emit light therefrom. The emitted light is changed into a line beam in the illumination optical system 43. The line beam travels via the mirror 46 into the spatial light modulator 441 of the spatial light modulation unit 44. The spatial light modulator 441 is disposed in such an attitude that the normals to the reflective surfaces of the plurality of modulation units 442 are inclined with respect to the optical axis of the incident light incoming via the mirror 46.

In the spatial light modulator 441, the plurality of modulation units 442 are arranged in the sub-scanning direction (in the X-axis direction), as mentioned above. A beam of incident light enters the modulation units 442 arranged in a line in such a manner that the longer dimension of the linear cross section of the incident light beam is along the arrangement of the modulation units 442. The controller 80 provides an instruction to the driver circuit unit based on the pattern data PD, whereby the driver circuit unit applies a voltage to some of the modulation units 442 specified by the instruction. This produces a drawing light beam of a strip-shaped cross-sectional configuration which includes light individually subjected to the spatial modulation in each of the modulation units 442, and the drawing light beam is emitted toward the substrate W. The light subjected to the spatial modulation in one of the modulation units 442 becomes the drawing light corresponding to one pixel. The drawing light emitted from the spatial light modulator 441 is the drawing light corresponding to a plurality of pixels disposed in the sub-scanning direction. The drawing light emitted from the spatial light modulator 441 enters the projection optical system 45. In the projection optical system 45, the unnecessary light included in the incident light is intercepted, and only the necessary light included in the incident light is guided to the upper surface of the substrate W. The necessary light is image-formed with the determined magnification on the upper surface of the substrate W.

Each of the optical units 40 continues to intermittently emit the drawing light corresponding to the plurality of pixels disposed in the sub-scanning direction (i.e., continues to project pulsed light repeatedly onto the surface of the substrate W) while moving in the main scanning direction (in the Y-axis direction) relative to the substrate W. Thus, when each of the optical units 40 is moved across the substrate W in the main scanning direction, a pattern group is drawn in a single strip-shaped region extending in the main scanning direction on the upper surface of the substrate W and having a width (referred to also as a "drawing width M" hereinafter) corresponding to the plurality of pixels disposed in the sub-scanning direction. After performing the main scanning process involving the emission of the drawing light, each of the optical units 40 is moved a predetermined distance relative to the substrate W in the sub-scanning direction (in the X-axis direction) orthogonal to the main scanning direction (which is referred to as a sub-scanning process), and then performs a main scanning process involving the emission of the drawing light again. Thus, a pattern group is drawn adjacent to the strip-shaped region subjected to the pattern drawing by the preceding main scanning process. In this manner, the main scanning process involving the emission of the drawing light is performed repeatedly, with the sub-scanning process performed between adjacent main scanning processes, whereby pattern groups are drawn in the entire region to be subjected to the pattern drawing.

<Imaging Part 50>

The imaging part 50 is provided fixedly on the support frame 107, and takes an image of an alignment mark formed on the upper surface of a substrate W held on the stage 10. The imaging part 50 includes, for example, a lens barrel, an objective lens, and a CCD image sensor including an area image sensor (or a two-dimensional image sensor). The imaging part 50 is connected via a fiber and the like to an illumination unit 501 for supplying illumination light for use in imaging. Light having a wavelength to which the resist lying on the substrate W or the like is not sensitive is used as this illumination light. Light emitted from the illumination unit 501 is guided by the fiber to the lens barrel, and is also guided through the lens barrel to the upper surface of the substrate W. The light reflected from the upper surface of the substrate W travels through the objective lens, and is received by the CCD image sensor. Thus, imaging data on the upper surface of the substrate W is acquired. The CCD image sensor acquires the imaging data in accordance with an instruction from the controller 80, and transmits the acquired imaging data to the controller 80. The imaging part 50 may further include an autofocus unit capable of autofocusing.

<Transport Device 60>

The transport device 60 is a device for transporting a substrate W. Specifically, the transport device 60 includes two hands 61 for supporting a substrate W, and a hand drive mechanism 62 for independently moving the hands 61 (back and forth, and up and down), for example. A cassette table 104 for placing a cassette C thereon is also disposed in a position lying outside the body of the drawing apparatus 1 and adjacent to the transfer region 103. The transport device 60 takes an unprocessed substrate W out of a cassette C placed on the cassette table 104 to transport the unprocessed substrate W into the processing region 102, and transports a processed substrate W out of the processing region 102 to store the processed substrate W into a cassette C. The transfer of a cassette C to and from the cassette table 104 is performed by an external transport device (not shown).

<Prealignment Part 70>

The prealignment part 70 is a device for roughly correcting the rotational position of a substrate W. The prealignment part 70 may include, for example, a rotatable table, a sensor for detecting the position of a cutout (for example, a notch and a orientation flat) formed in part of the outer peripheral edge of the substrate W placed on the table, and a rotational mechanism for rotating the table. In this case, a prealignment process in the prealignment part 70 is performed by initially detecting the position of the cutout of the substrate W placed on the table by means of the sensor, and subsequently rotating the table by means of the rotational mechanism so that the cutout is at a determined position.

<Controller 80>

The controller 80 is electrically connected to the components included in the drawing apparatus 1, and controls the operations of the components of the drawing apparatus 1 while performing various computational processes.

As shown in FIG. 3 for example, the controller 80 is configured to include a typical computer in which a CPU 81, a ROM 82, a RAM 83, the storage device 84 and the like are interconnected through a bus line 85. The ROM 82 stores a basic program and the like therein, and the RAM 83 serves as a work area used when the CPU 81 performs a predetermined process. The storage device 84 is formed by a flash memory or a nonvolatile storage device such as a hard disk device. A program P is stored in the storage device 84. The CPU 81 serving as a main controller performs a computational process in accordance with a procedure descried in the program P, whereby various functions are performed. In general, the program P is used while being previously stored in a memory of the storage device 84 and the like. However, the program P may be provided in a form (in the form of a program product) stored in a storage medium such as a CD-ROM, a DVD-ROM and an external flash memory (or provided by downloading from an external server through a network), and be stored in the memory of the storage device 84 and the like in an additional or replaceable manner. Some or all of the functions performed in the controller 80 may be implemented by a purpose-built logic circuit and the like in the form of hardware.

The controller 80 further includes an input part 86, a display part 87, and a communication part 88 which are also connected to the bus line 85. The input part 86 is an input device formed by, for example, a keyboard and a mouse, and accepts various manipulations (including the entry of commands and various data) from an operator. The input part 86 may be formed by various switches, a touch panel and the like. The display part 87 is a display device formed by a liquid crystal display device, a lamp and the like, and displays various pieces of information under the control of the CPU 81. The communication part 88 has a data communication function for transmitting and receiving commands, data and the like to and from external devices through a network.

<2. Registration of Light Outgoing Ratio Function>

<2-1. Type of Shape of Light Outgoing Ratio Function>

As stated above, the spatial light modulator 441 in the drawing apparatus 1 includes the group of modulation units 442 arranged in a line. The spatial light modulator 441 is connected to the light outgoing ratio adjustment part 400 for individually adjusting the light outgoing ratio of each of the modulation units 442. A function defining a relationship between the position of the modulation units 442 as seen in the direction of the arrangement of the modulation units 442 and the light outgoing ratio is referred to as a "light outgoing ratio function." The provision of the light outgoing ratio adjustment part 400 in the drawing apparatus 1 allows the adjustment of the shape of the light outgoing ratio function to any shape. It should be noted that the light outgoing ratio function used herein is represented by the position of the modulation units 442 as seen in the direction of the arrangement of the modulation units 442 as the abscissa and the light outgoing ratio as the ordinate (with reference to FIG. 4, for example).

The shape of the light outgoing ratio function defines the profile (outline) of a light amount distribution of the drawing light emitted from the spatial light modulator 441 throughout the direction of the longer dimension of the strip-shaped cross section of the drawing light beam. The present inventors have found that the appropriate adjustment of the shape of the light outgoing ratio function reduces the nonuniformity of light exposure in boundary sections between the strip-shaped regions and that there is a type of shape of the light outgoing ratio function which effectively reduces the nonuniformity of light exposure in accordance with the type of nonuniformity of light exposure. The type of shape of the light outgoing ratio function will be described below.

<Rectangular Type>

Figure 4:
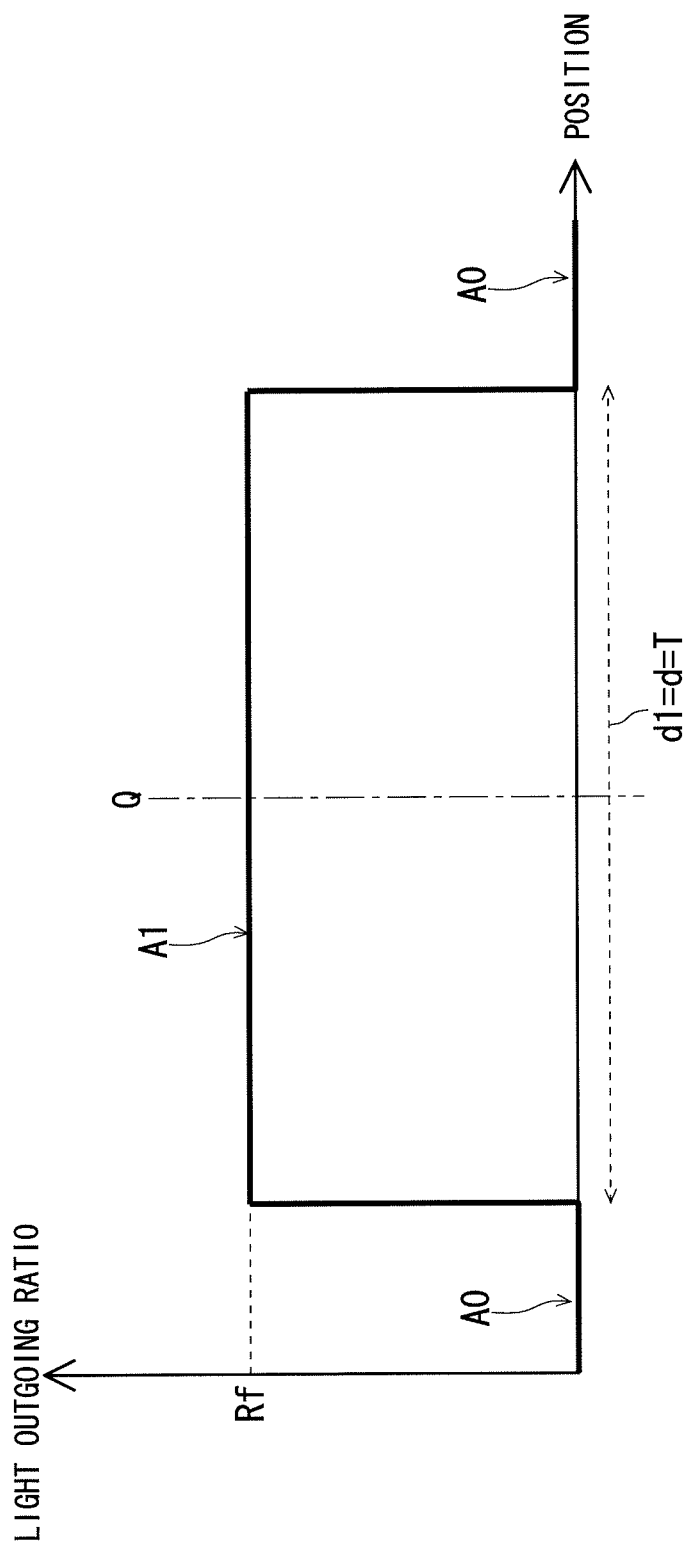
FIG. 4 is a graph showing a light outgoing ratio function of a rectangular type.
Figure 5:
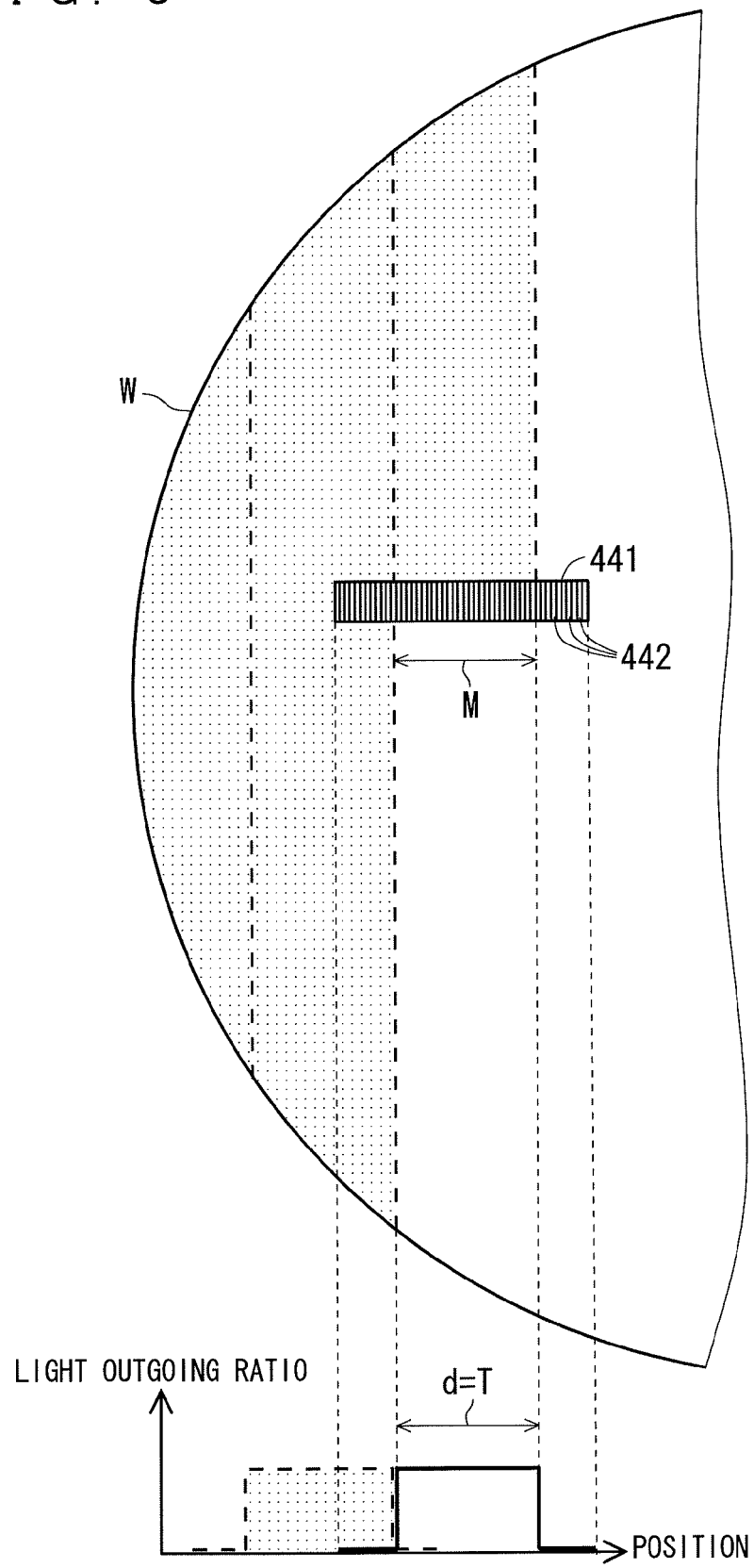
FIG. 5 shows a relationship between the position of the arrangement of a group of modulation units and strip-shaped regions when a distribution of light outgoing ratios of the modulation units is adjusted to be of a rectangular type.

FIG. 4 is a graph showing a light outgoing ratio function of a "rectangular type" which is a first type of shape. FIG. 5 shows a relationship between the light outgoing ratio function of the rectangular type and the strip-shaped regions.

The light outgoing ratio function of the rectangular type is what is called a "rectangular function" such that the opposite edges, i.e. rising and falling edges, of a mid-portion A1 having a constant light outgoing ratio are vertical edges. Specifically, the light outgoing ratio function of the rectangular type has the mid-portion A1 where the light outgoing ratio remains constant at a predetermined value Rf (e.g., 100% which is also referred to as a "maximum light outgoing ratio") greater than zero, and end portions A0 where the light outgoing ratio remains constant at zero, the end portions A0 being continuous with the opposite edges of the mid-portion A1. The middle position of the mid-portion A1 coincides with a middle position Q of the modulation units 442 as seen in the direction of the arrangement of the modulation units 442.

In the light outgoing ratio function, the end portions A0 where the light outgoing ratio is zero means that the on-state light outgoing ratio of some of the modulation units 442 disposed in the end portions A0 is made zero. These modulation units 442 do not contributes to the formation of the drawing light. In other words, the drawing light is formed substantially using only some of the modulation units 442 each having a light outgoing ratio greater than zero. Thus, the width (referred to hereinafter as an "effective width d") of a region where the light outgoing ratio is greater than zero in the light outgoing ratio function corresponds to the aforementioned drawing width M. For the light outgoing ratio function of the rectangular type, the width d1 of the mid-portion A1 is equal to the effective width d.

The effective width d in the light outgoing ratio function of the rectangular type provides the drawing width M equal to the distance of movement in the sub-scanning process. Thus, when a distribution of the light outgoing ratios of the group of modulation units 442 is adjusted to be of the rectangular type (more specifically, when the light outgoing ratios of the respective modulation units 442 are adjusted so that the relationship between the position of the modulation units 442 as seen in the direction of the arrangement of the modulation units 442 and the light outgoing ratio coincides with the light outgoing ratio function of the rectangular type), an edge of a strip-shaped region subjected to the pattern drawing by each main scanning process (an edge along the sub-scanning direction) is adjacent to and in intimate contact with a strip-shaped region subjected to the pattern drawing by the preceding main scanning process. In a default state in the drawing apparatus 1, the distribution of the light outgoing ratios of the group of modulation units 442 is adjusted to be of the rectangular type.

The width of the arrangement of the modulation units 442 corresponding to the effective width d in the light outgoing ratio function of the rectangular type (i.e., the effective width d which provides the drawing width M equal to the distance of movement in the sub-scanning process) is referred to also as a "reference width T" hereinafter. When the effective width d in the light outgoing ratio function is greater than the reference width T, the strip-shaped region subjected to the pattern drawing by each main scanning process overlaps the strip-shaped region subjected to the pattern drawing by the preceding main scanning process at their edges.

<Stepped Type>

Figure 6:
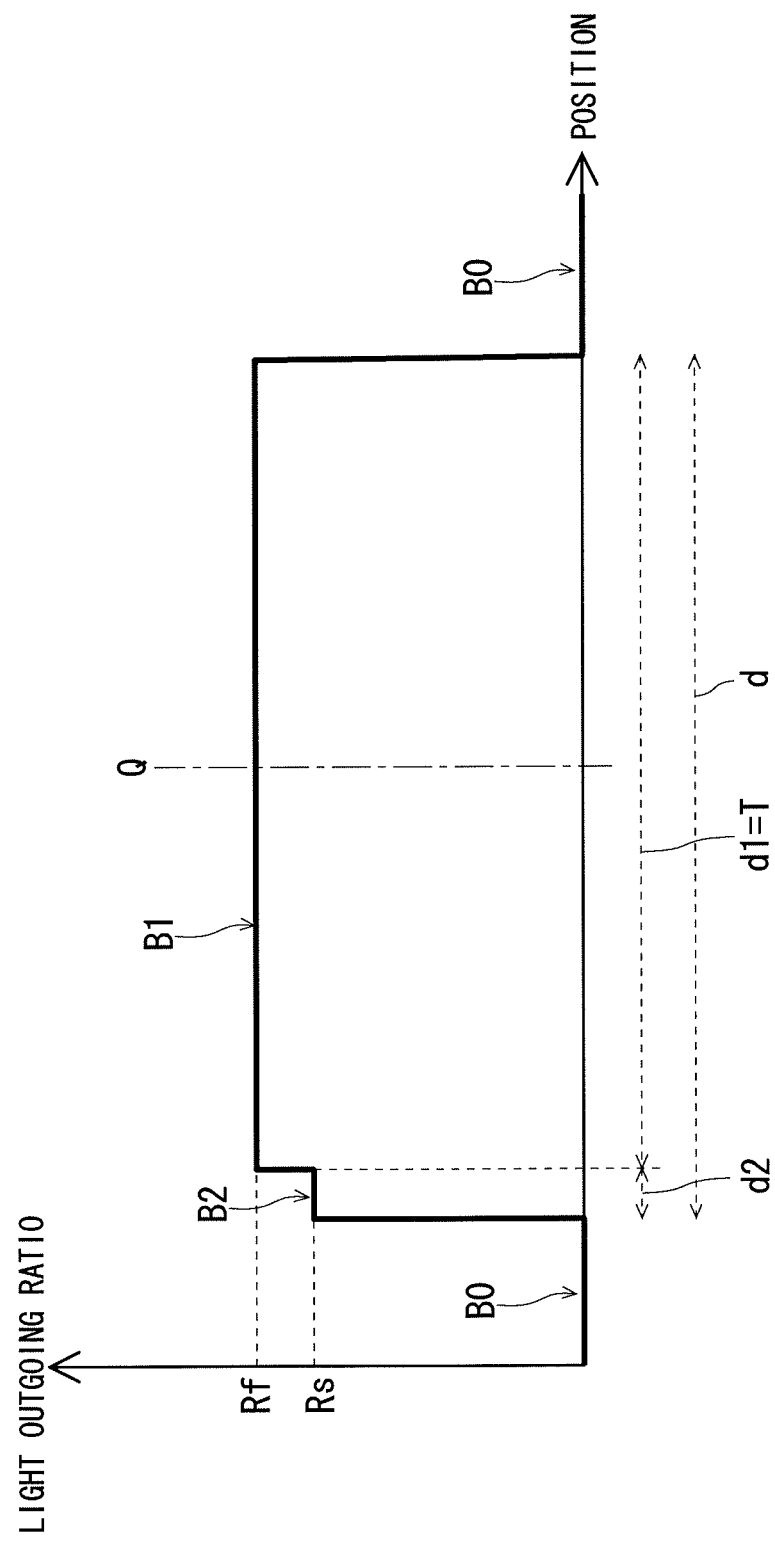
FIG. 6 is a graph showing a light outgoing ratio function of a stepped type.
Figure 7:
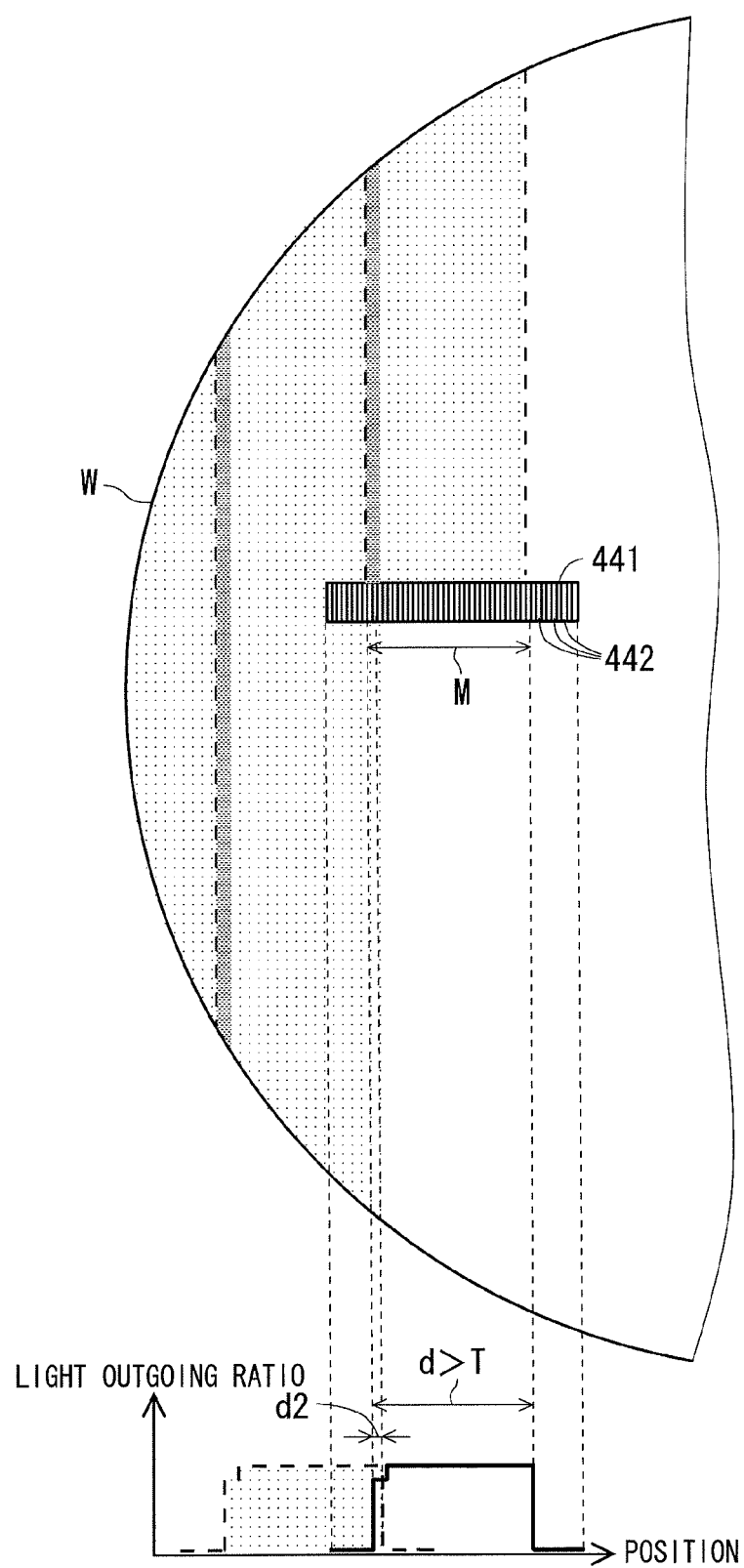
FIG. 7 shows a relationship between the position of the arrangement of a group of modulation units and strip-shaped regions when a distribution of the light outgoing ratios of the modulation units is adjusted to be of a stepped type.

FIG. 6 is a graph showing a light outgoing ratio function of a "stepped type" which is a second type of shape. FIG. 7 shows a relationship between the light outgoing ratio function of the stepped type and the strip-shaped regions.

The light outgoing ratio function of the stepped type is what is called a "step function" such that one of the opposite edges, i.e. rising and falling edges, of a mid-portion B1 having a constant light outgoing ratio is a stepped edge. Specifically, the light outgoing ratio function of the stepped type has the mid-portion B1 where the light outgoing ratio remains constant at the maximum light outgoing ratio Rf, a first end portion B0 where the light outgoing ratio remains constant at zero, the first end portion B0 being continuous with one of the edges of the mid-portion B1, a changed portion B2 where the light outgoing ratio is changed in stepped form, the changed portion B2 being continuous with the other edge of the mid-portion B1, and a second end portion B0 where the light outgoing ratio remains constant at zero, the second end portion B0 being continuous with one of the edges of the changed portion B2. Also in this case, the middle position of the mid-portion B1 coincides with the middle position Q of the modulation units 442 as seen in the direction of the arrangement of the modulation units 442.

In this case, the changed portion B2 forms a single step at one of the rising and falling edges of the mid-portion B1. The single step has a width equal to the width d2 of the changed portion B2, and a height equal to the light outgoing ratio Rs of the changed portion B2.

The light outgoing ratio function of the stepped type corresponds to the addition of the changed portion B2 to the light outgoing ratio function of the rectangular type. Specifically, the width d1 of the mid-portion B1 in the light outgoing ratio function of the stepped type is equal to the reference width T, and the effective width d in the light outgoing ratio function of the stepped type is greater by the width d2 of the changed portion B2 than the reference width T. Thus, the effective width d in the light outgoing ratio function of the stepped type provides the drawing width M greater by the amount corresponding to the width d2 of the changed portion B2 than the distance of movement in the sub-scanning process.

Thus, when the distribution of the light outgoing ratios of the group of modulation units 442 is adjusted to be of the stepped type, the strip-shaped region subjected to the pattern drawing by each main scanning process overlaps the strip-shaped region subjected to the pattern drawing by the preceding main scanning process at their edges, as shown in FIG. 7. The width of the overlap corresponds to the width d2 of the changed portion B2, and some of the modulation units 442 disposed in the changed portion B2 are responsible for the light exposure of an upper layer portion of the overlap. In other words, the amount of light exposure of the upper layer portion is defined by the light outgoing ratios Rs of the modulation units 442 disposed in the changed portion B2.

It is assumed that, when the drawing process is performed on a substrate W, for example, in a default state (a state where the distribution of the light outgoing ratios of the group of modulation units 442 is adjusted to be of the rectangular type) (with reference to FIG. 5), at least one of the patterns formed on the substrate W which crosses the boundary of strip-shaped regions has a break with a slight width (for example, a width corresponding to one or two pixels) or an extremely narrow portion with the slight width in the boundary section.

In this case, it is inferred that the amount of light exposure drops relatively greatly in a relatively small area in the boundary section. When the distribution of the light outgoing ratios of the group of modulation units 442 is adjusted to be of the stepped type (more specifically, the light outgoing ratios of the respective modulation units 442 are adjusted so that the relationship between the position of the modulation units 442 as seen in the direction of the arrangement of the modulation units 442 and the light outgoing ratio coincides with the light outgoing ratio function of the stepped type) while such non-uniformity of light exposure occurs, the emission of the drawing light from the modulation units 442 disposed in the changed portion B2 is added to the boundary section, thereby increasing the amount of light exposure in the boundary section. As a result, a break in the patterns in the boundary section is eliminated. In this manner, when the nonuniformity of light exposure occurs in such a manner that the amount of light exposure is varied greatly in a relatively small area in the boundary section, a change in the shape of the light outgoing ratio function from the rectangular type to the stepped type effectively reduces the nonuniformity of light exposure.

<Trapezoidal Type>

Figure 8:
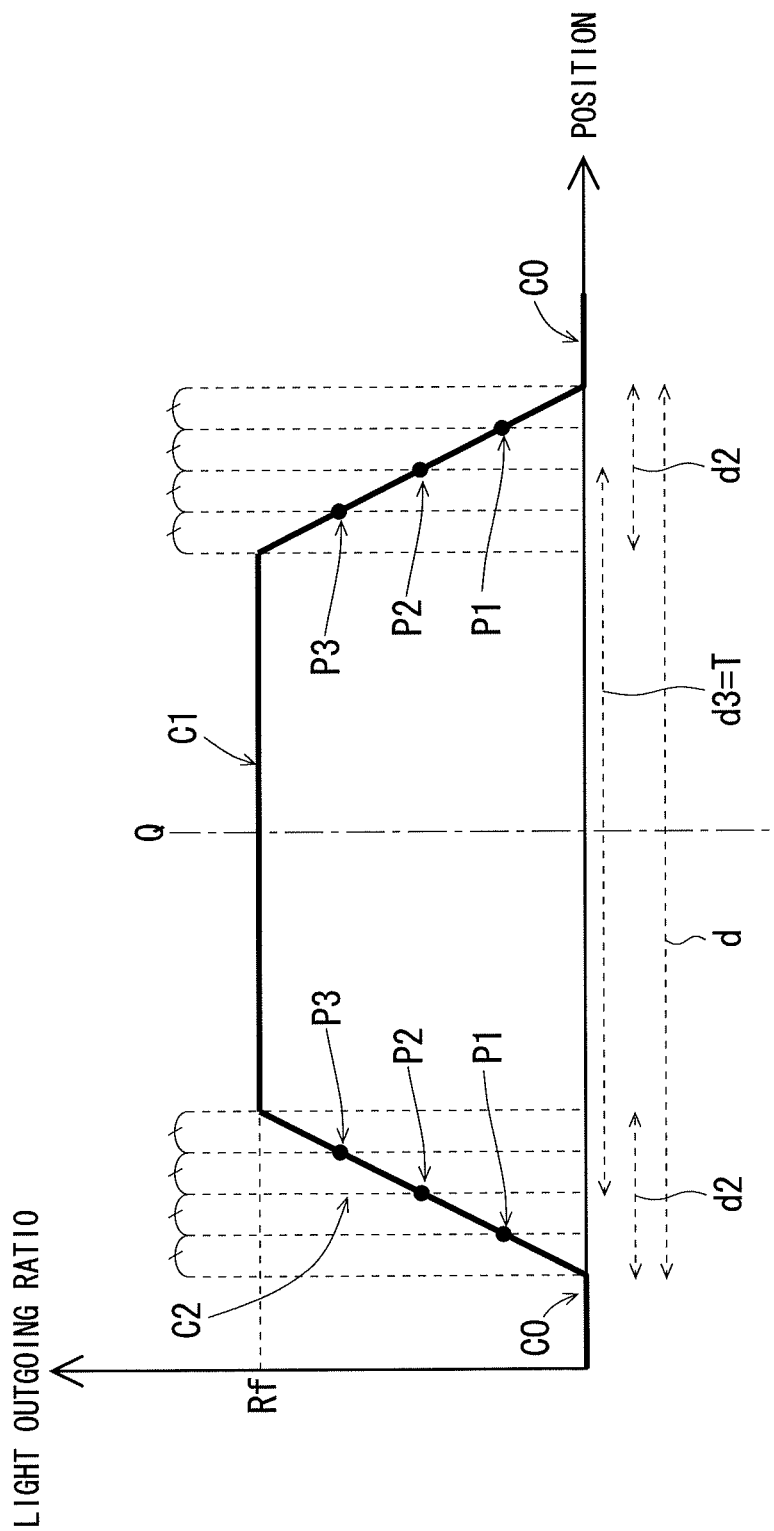
FIGS. 8 and 9 are graphs showing light outgoing ratio functions of a trapezoidal type.
Figure 9:
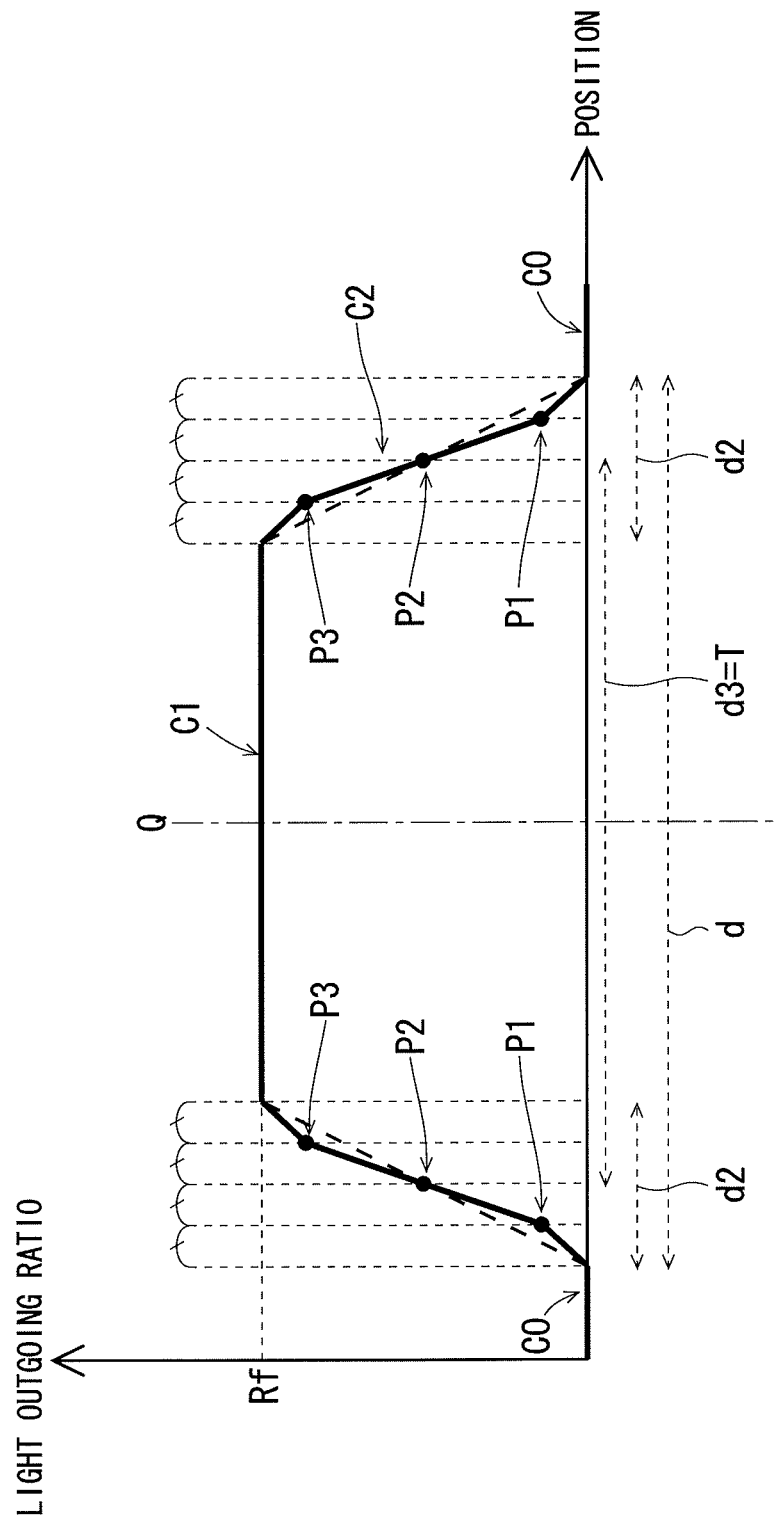
Figure 10:
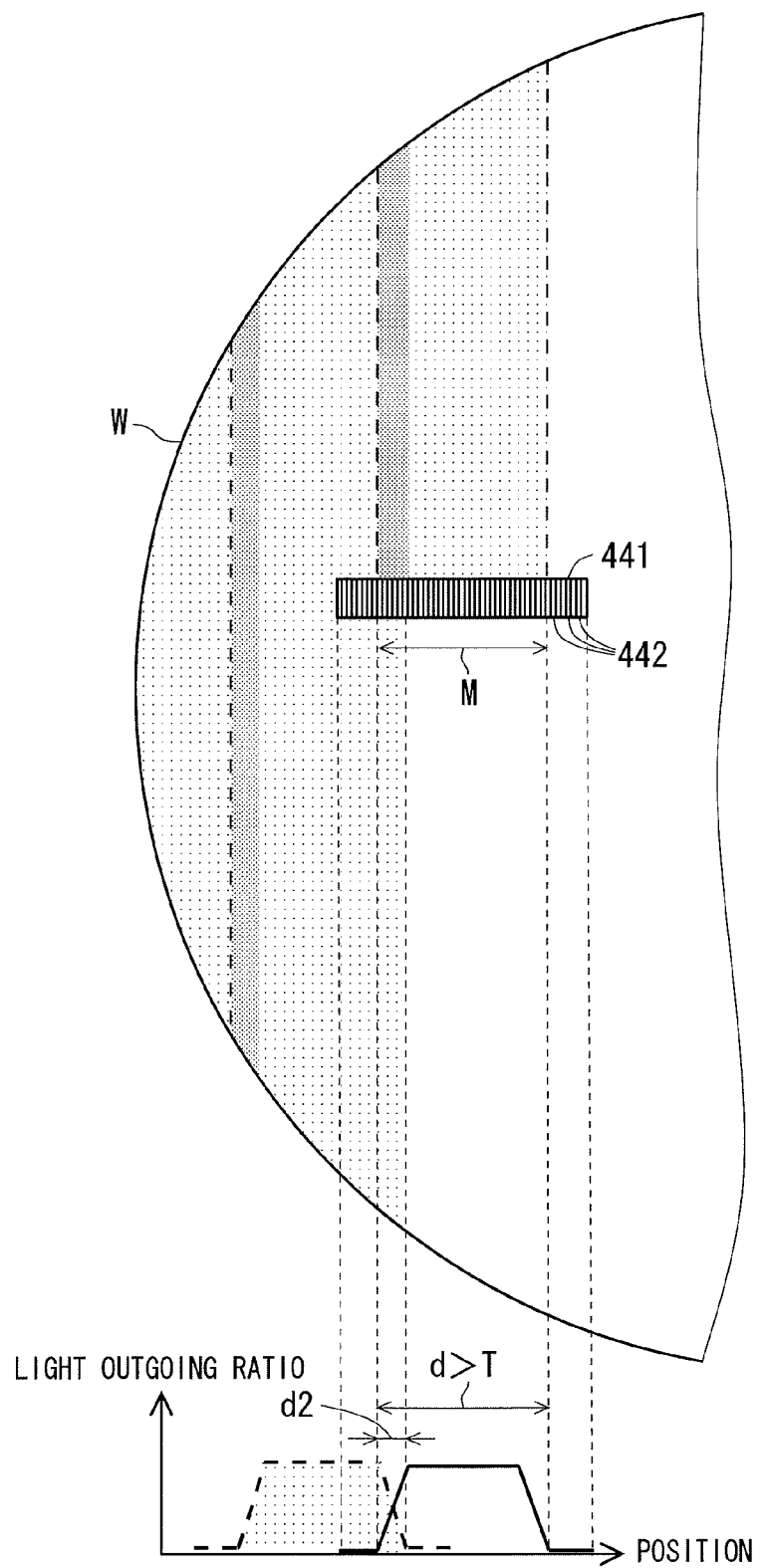
FIG. 10 shows a relationship between the position of the arrangement of a group of modulation units and strip-shaped regions when a distribution of the light outgoing ratios of the modulation units is adjusted to be of a trapezoidal type.

FIGS. 8 and 9 are graphs showing light outgoing ratio functions of a "trapezoidal type" which is a third type of shape. FIG. 10 shows a relationship between the light outgoing ratio function of the trapezoidal type and the strip-shaped regions.

The light outgoing ratio function of the trapezoidal type is what is called a "trapezoidal function" such that the opposite edges, i.e. rising and falling edges, of a mid-portion C1 having a constant light outgoing ratio are inclined edges. Specifically, the light outgoing ratio function of the trapezoidal type has the mid-portion C1 where the light outgoing ratio remains constant at the maximum light outgoing ratio Rf, changed portions C2 where the light outgoing ratio is changed in inclined form, the changed portions C2 being continuous with the opposite edges, respectively, of the mid-portion C1, and end portions C0 where the light outgoing ratio remains constant at zero, the end portions C0 being continuous with edges of the changed portions C2, respectively. Also in this case, the middle position of the mid-portion C1 coincides with the middle position Q of the modulation units 442 as seen in the direction of the arrangement of the modulation units 442.

In the light outgoing ratio function of the trapezoidal type, a distance d3 between the middle positions P2 of the respective changed portions C2 as seen in the width direction is equal to the reference width T. That is, the effective width d in the light outgoing ratio function of the trapezoidal type is greater by the width d2 of the changed portions C2 than the reference width T. Thus, the effective width d in the light outgoing ratio function of the trapezoidal type provides the drawing width M greater by the amount corresponding to the width d2 of the changed portions C2 than the distance of movement in the sub-scanning process.

Thus, when the distribution of the light outgoing ratios of the group of modulation units 442 is adjusted to be of the trapezoidal type, the strip-shaped region subjected to the pattern drawing by each main scanning process overlaps the strip-shaped region subjected to the pattern drawing by the preceding main scanning process at their edges, as shown in FIG. 10. The width of the overlap corresponds to the width d2 of the changed portions C2. Some of the modulation units 442 disposed in one of the changed portions C2 on opposite sides of the mid-portion C1 are responsible for the light exposure of a lower layer portion of the overlap, and some of the modulation units 442 disposed in the other changed portion C2 are responsible for the light exposure of an upper layer portion of the overlap.

It is assumed that, when the drawing process is performed on a substrate W, for example, in a default state (with reference to FIG. 5), at least one of the patterns formed on the substrate W which crosses the boundary of strip-shaped regions is relatively thin (or thick) for a relatively large width (for example, a width corresponding to 20 pixels) in the boundary section of the strip-shaped regions. In this case, it is inferred that the amount of light exposure drops relatively gradually (or increases relatively gradually) in a relatively large area in the boundary section. When the distribution of the light outgoing ratios of the group of modulation units 442 is adjusted to be of the trapezoidal type (more specifically, the light outgoing ratios of the respective modulation units 442 are adjusted so that the relationship between the position of the modulation units 442 as seen in the direction of the arrangement of the modulation units 442 and the light outgoing ratio coincides with the light outgoing ratio function of the trapezoidal type) while such nonuniformity of light exposure occurs, the drawing in the boundary section is performed by the superposition of drawing light beams emitted from the modulation units 442 disposed in the changed portions C2, whereby the fine adjustment of the amount of light exposure in the boundary section is achieved. As a result, the changes in line width of the patterns in the boundary section are eliminated. In this manner, when the nonuniformity of light exposure occurs in such a manner that the amount of light exposure is varied gradually in a relatively large area in the boundary section, a change in the shape of the light outgoing ratio function from the rectangular type to the trapezoidal type effectively reduces the nonuniformity of light exposure.

<2-2. Shape Registration Part 800>

The drawing apparatus 1 further includes a shape registration part 800 for accepting the registration of the shape of the light outgoing ratio function from an operator. The shape registration part 800 will be described with reference to FIG. 11. FIG. 11 is a block diagram showing a configuration related to the functional part.

The shape registration part 800 includes an acceptance part 801 and a registration part 802. These parts are implemented in the controller 80 by the CPU 81 performing a computation process in accordance with a procedure written in the program P.

The acceptance part 801 causes an acceptance screen 9 to be described later to appear on the display part 87, and accepts the registration of the shape of the light outgoing ratio function from an operator via the acceptance screen 9.

The registration part 802 stores the shape of the light outgoing ratio function registered by the operator via the acceptance screen 9 in association with processing conditions of the drawing process into a database D stored in the storage device 84. The processing conditions of the drawing process specifically include the type of a photosensitive material, the speed of movement of the optical units 40 relative to the substrate W in the drawing process (in this preferred embodiment, the speed of movement of the stage 10), the dimensions of the substrate W, the type of the substrate W, and the like. The process for storing the registered shape of the light outgoing ratio function in association with the processing conditions is not limited to this. For example, the registration part 802 may store the shape of the light outgoing ratio function in association with information for specifying the processing conditions (specifically, identification information about a recipe including descriptions of the processing conditions (e.g., a recipe number)) into the storage device 84 or may write the shape of the light outgoing ratio function directly into the recipe. In the latter case, the shape of the light outgoing ratio function is held as a piece of recipe information.

<2-3. Acceptance Screen 9>

Figure 12:
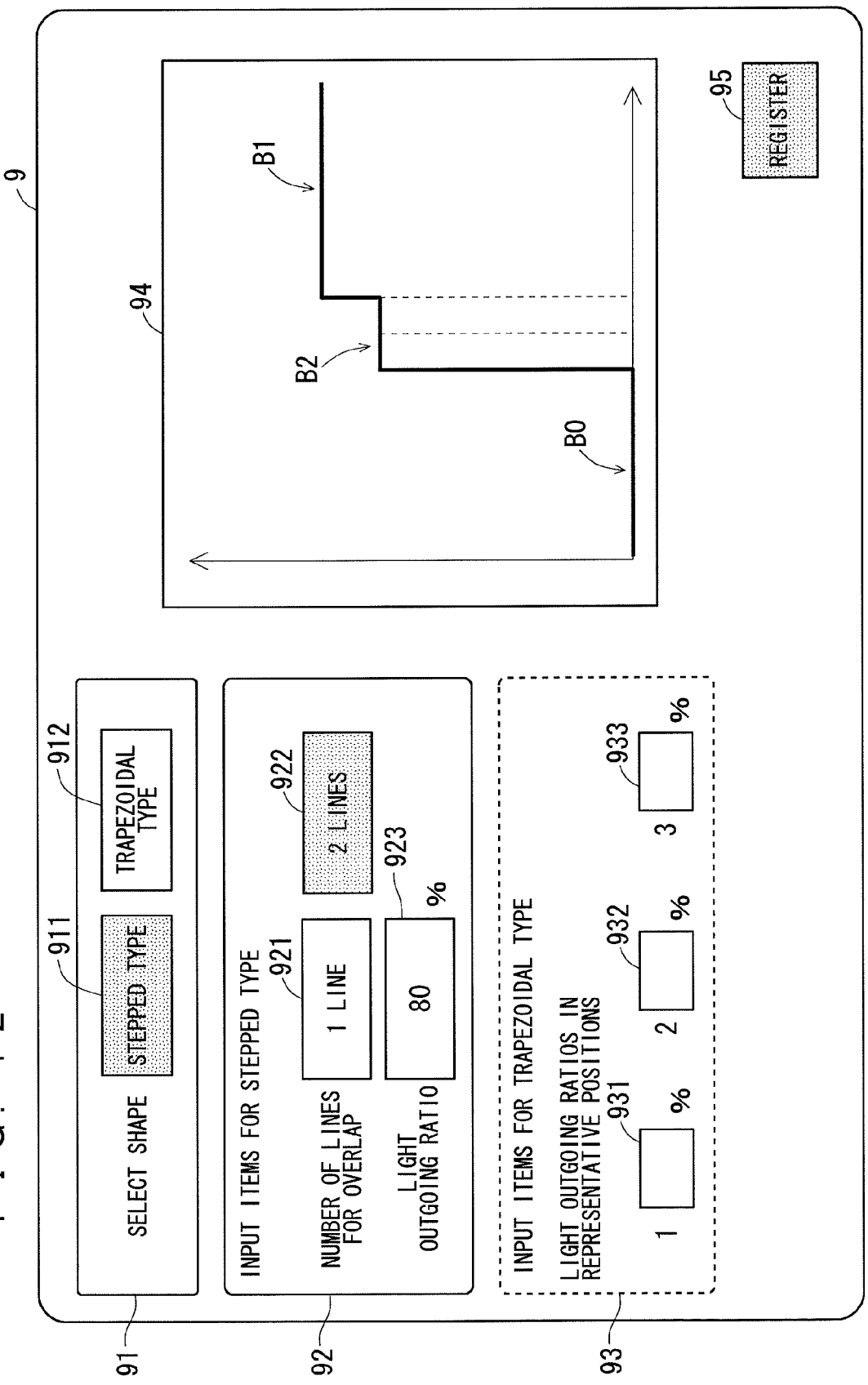
FIGS. 12, 13 and 14 are views schematically showing examples of the configuration of an acceptance screen.
Figure 13:
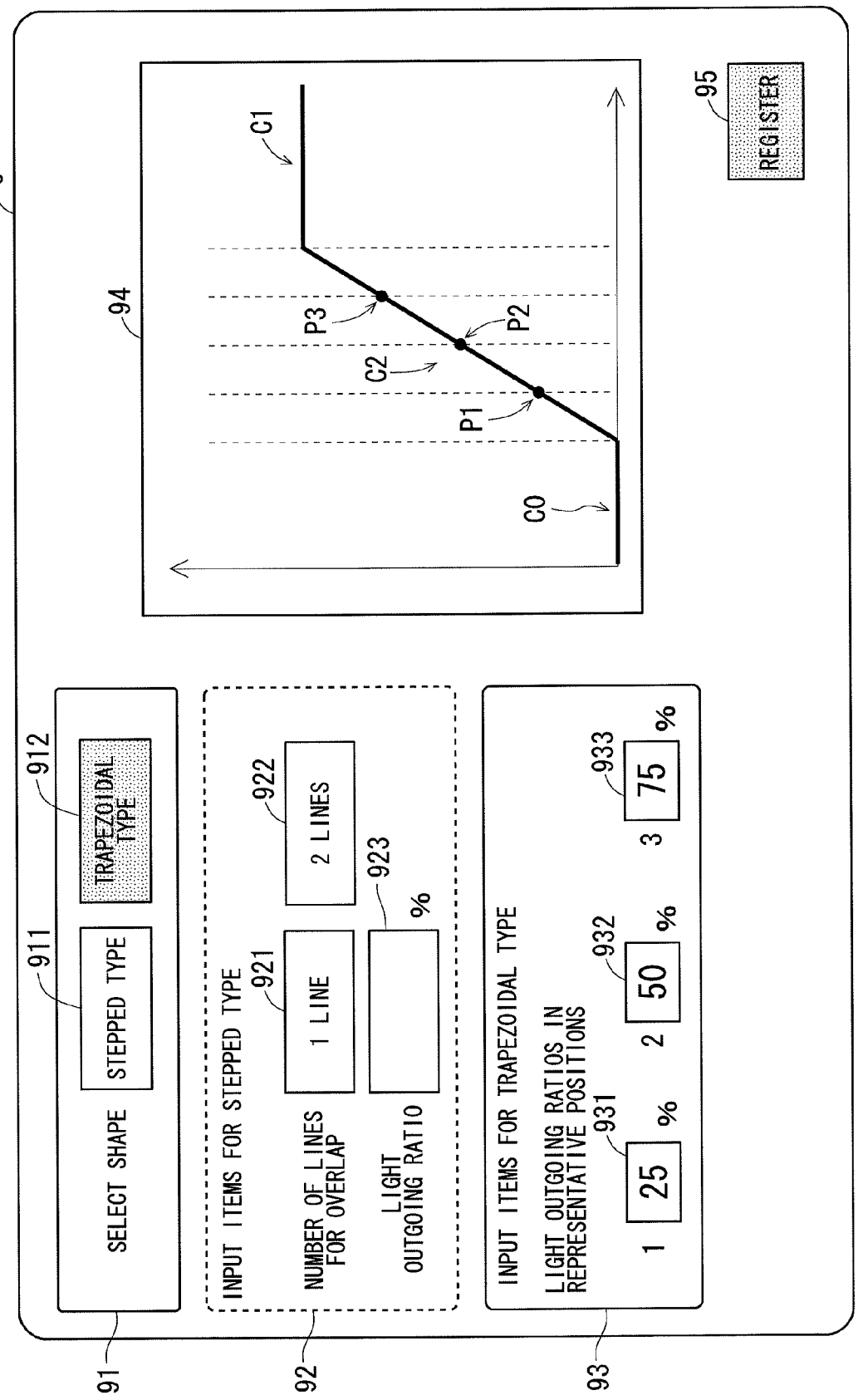
Figure 14:
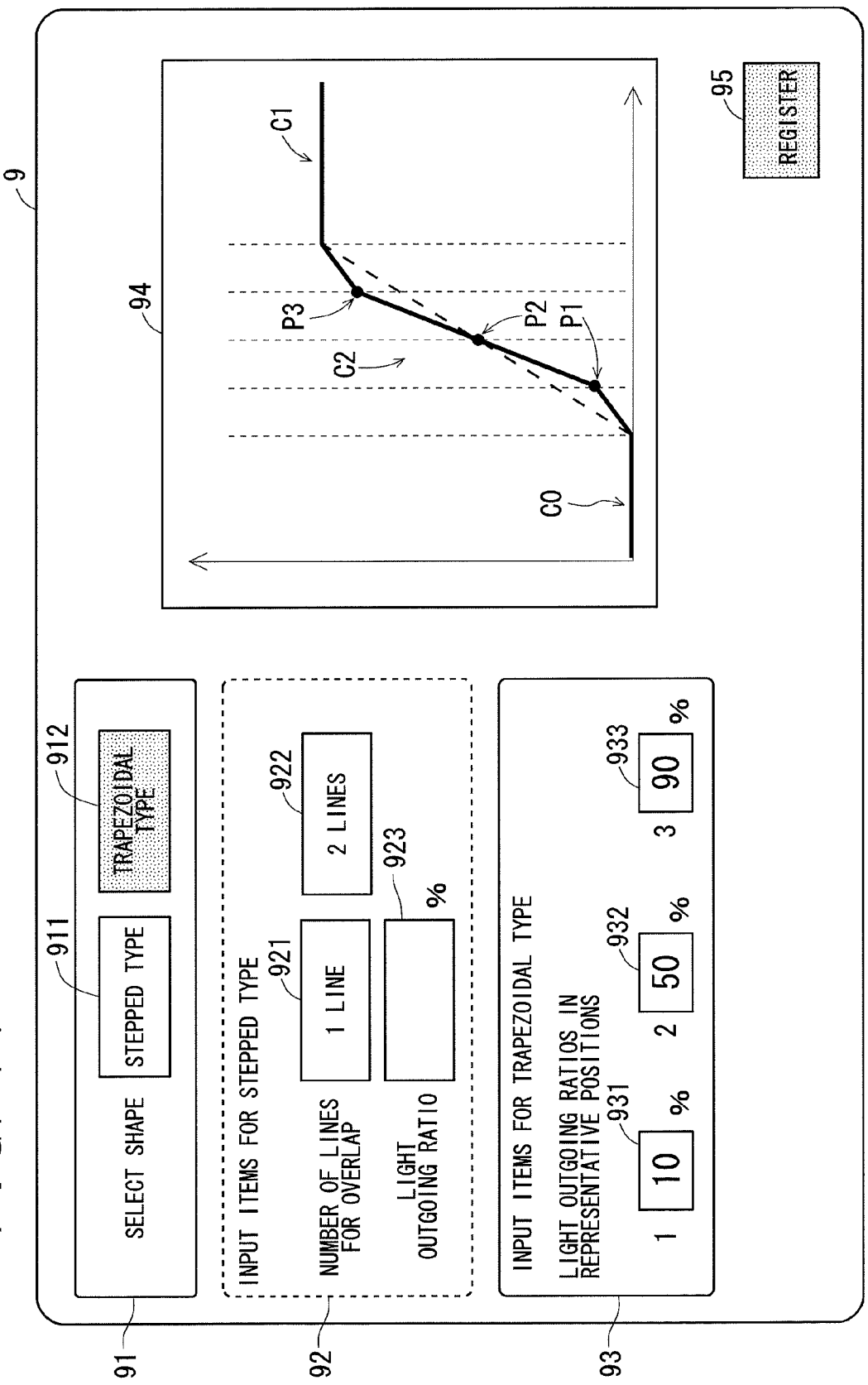

The configuration of the acceptance screen 9 will be described with reference to FIGS. 12 to 14. FIGS. 12 to 14 schematically show respective examples of the configuration of the acceptance screen 9. In particular, the acceptance screen 9 in the cased where the stepped type is selected as the type of shape of the light outgoing ratio function is illustrated in FIG. 12. The acceptance screen 9 in the case where the trapezoidal type is selected as the type of shape of the light outgoing ratio function is illustrated in FIGS. 13 and 14.

The acceptance screen 9 includes a shape type selection area 91, an input item area 92 for the stepped type, an input item area 93 for the trapezoidal type, a shape display area 94, and a registration icon 95.

<Shape Type Selection Area 91>

A selection manipulation for selecting the type of shape of the light outgoing ratio function from among a plurality of shape type candidates is accepted in the shape type selection area 91.

Specifically, the shape type candidates are displayed in list form in the shape type selection area 91. The names of the shape type displayed in list form appear in the form of icons for selection of the shape type. In this preferred embodiment, the "stepped type" (with reference to FIG. 6) and the "trapezoidal type" (with reference to FIGS. 8 and 9) mentioned above are the shape type candidates. A first icon 911 for accepting the selection of the stepped type and a second icon 912 for accepting the selection of the trapezoidal type are displayed in the shape type selection area 91.

An operator manipulates the first icon 911 to select the stepped type as the type of shape of the light outgoing ratio function, and manipulates the second icon 912 to select the trapezoidal type as the type of shape of the light outgoing ratio function.

<Input Item Area 92 for Stepped Type>

In the input item area 92 for the stepped type, one or more input items related to the light outgoing ratio function of the stepped type are displayed, and an input manipulation for each of the input items is accepted. In this preferred embodiment, the width d2 of the changed portion B2 and the light outgoing ratio Rs of the changed portion B2 shall be the input items related to the light outgoing ratio function of the stepped type (with reference to FIG. 6).

Specifically, a plurality of icons 921 and 922 for accepting the selection of the number of lines by which strip-shaped regions overlap each other (where one line means a line having a width corresponding to one pixel) in the drawing process are displayed in the input item area 92 for the stepped type. An operator manipulates an icon indicating a desired number of lines to specify the number of lines for the overlap. The width by which the strip-shaped regions overlap each other corresponds to the width d2 of the changed portion B2 in the light outgoing ratio function of the stepped type, as mentioned above. Thus, the width d2 of the changed portion B2 in the light outgoing ratio function of the stepped type is specified by specifying the number of lines for the overlap.

In this preferred embodiment, the acceptance of the specification of the width d2 of the changed portion B2 by the name of "number of lines for overlap" which an operator can intuitively understand improves the ease of understanding of the manipulation. The excessive increase in the number of lines for the overlap in the light outgoing ratio function of the stepped type makes it difficult to ensure the uniformity of the amount of light exposure in the boundary section of the strip-shaped regions. In this preferred embodiment, such difficulties are avoided by causing an operator to select only a predetermined number of lines or less (preferably two lines or less), rather than causing an operator to input the number of lines for the overlap.

An input box 923 for accepting the input of the light outgoing ratio Rs of the changed portion B2 is also displayed in the input item area 92 for the stepped type. Only a value greater than zero and not greater than the maximum light outgoing ratio Rf is allowed to be inputted into the input box 923. An operator inputs any value in the allowable range into the input box 923 to specify the light outgoing ratio Rs of the changed portion B2 in the light outgoing ratio function of the stepped type.

<Input Item Area 93 for Trapezoidal Type>

In the input item area 93 for the trapezoidal type, one or more input items related to the light outgoing ratio function of the trapezoidal type are displayed, and an input manipulation for each of the input items is accepted. In this preferred embodiment, the light outgoing ratio(s) in one or more representative positions included in the changed portions C2 shall be the input item(s) related to the light outgoing ratio function of the trapezoidal type. Preferably, such a representative position is a position in which each of the changed portions C2 is divided into equal parts. The number of representative positions is preferably not greater than three. In an instance shown, three positions P1, P2 and P3 in which each of the changed portions C2 is divided into four equal parts shall be the representative positions.

Specifically, first, second and third input boxes 931, 932 and 933 for accepting the input of the light outgoing ratios of the respective representative positions P1, P2 and P3 are displayed in the input item area 93 for the trapezoidal type. It should be noted that only a value greater than zero and not greater than the maximum light outgoing ratio Rf is allowed to be inputted into each of the input boxes 931, 932 and 933. Only a value not less than the value inputted into the first input box 931 which accepts the input of the light outgoing ratio in the representative position (first representative position) P1 closer to the end portions C0 is allowed to be inputted into the second input box 932 which accepts the input of the light outgoing ratio in the middle representative position (second representative position) P2. Also, only a value not less than the value inputted into the second input box 932 is allowed to be inputted into the third input box 933 which accepts the input of the light outgoing ratio in the representative position (third representative position) P3 closer to the mid-portion C1. An operator inputs any value in the allowable range into each of the input boxes 931, 932 and 933 to specify the form of change (i.e., a change rate) of the changed portions C2 in the light outgoing ratio function of the trapezoidal type. It should be noted that the two changed portions C2 in the light outgoing ratio function of the trapezoidal type are mirror images of each other. Thus, when the form of change of one of the changed portions C2 is defined, the form of change of the other changed portion C2 is uniquely defined.

For example, an operator specifies the light outgoing ratio in the first representative position P1 as "25%," the light outgoing ratio in the second representative position P2 as "50%," and the light outgoing ratio in the third representative position P3 as "75%" as illustrated in FIG. 13 to specify the light outgoing ratio function in which the amount of change in the changed portions C2 is constant (with reference to FIG. 8). As another example, an operator specifies the light outgoing ratio in the first representative position P1 as "10%," the light outgoing ratio in the second representative position P2 as "50%," and the light outgoing ratio in the third representative position P3 as "80%" as illustrated in FIG. 14 to specify the light outgoing ratio function in which the amount of change in the changed portions C2 is changed midway to show an S-shaped configuration (with reference to FIG. 9). As mentioned above, the drawing in the boundary section of strip-shaped regions in the drawing process is performed by the superposition of drawing light beams emitted from the modulation units 442 disposed in the changed portions C2. Thus, the fine adjustment of the amount of light exposure in the boundary section is achieved by changing the form of change in the changed portions C2. In particular, the changed portions C2 of the S-shaped configuration provides the light outgoing ratio which changes relatively smoothly throughout the light outgoing ratio function, thereby providing a smooth change in the amount of light exposure in the boundary section. This is particularly effective for reduction in the nonuniformity of light exposure. The use of the three positions P1, P2 and P3 in which each of the changed portions C2 is divided into four equal parts as the representative positions enables the changed portions C2 of the S-shaped configuration to be defined easily and appropriately.

In this preferred embodiment, the width d2 of the changed portions C2 is not set by accepting the specification from an operator, but is fixed at a predetermined value. The excessive increase in the number of lines for the overlap in the light outgoing ratio function of the trapezoidal type also makes it difficult to ensure the uniformity of the amount of light exposure in the boundary section of the strip-shaped regions. In this preferred embodiment, such difficulties are avoided by fixing the number of lines for the overlap at a predetermined number of lines (preferably approximately 20 lines, for example), rather than causing an operator to input the number of lines for the overlap.

<Shape Display Area 94>

The light outgoing ratio function defined from the information inputted in the shape type selection area 91 and the input item areas 92 and 93 is schematically displayed partially or entirely in the shape display area 94. Since the input items are in particular related to the changed portions B2 and C2, it is preferable that the changed portions B2 and C2 in the light outgoing ratio function are displayed on an enlarged scale, as shown.

An operator views the light outgoing ratio function displayed in the shape display area 94 to check whether the light outgoing ratio function is of a desired shape or not, thereby changing an input value and the like for the desired shape, as required.

<Registration Icon 95>

The registration icon 95 is an icon for accepting the registration of the information inputted in the shape type selection area 91 and the input item areas 92 and 93. An operator manipulates the registration icon 95 to register the information inputted in the shape type selection area 91 and the input item areas 92 and 93.

<2-4. Procedure>

The drawing apparatus 1 allows an operator to register the light outgoing ratio function having any shape in association with the processing conditions of the drawing process. In a default state in the drawing apparatus 1, the distribution of the light outgoing ratios of the group of modulation units 442 is adjusted to be of the rectangular type, as mentioned above. In other words, the light amount distribution of the drawing light emitted from the spatial light modulator 441 as seen in the direction of the longer dimension of the strip-shaped cross section of the drawing light beam is adjusted to become uniform. The operator checks the result of light exposure obtained by performing the drawing process in the default state, for example. If the nonuniformity of light exposure occurs in the boundary section of the strip-shaped regions, the operator may store a shape of the light outgoing ratio function which reduces the nonuniformity of light exposure in association with processing conditions. A procedure related to the registration of the shape of the light outgoing ratio function will be described with reference to FIG. 15. FIG. 15 is a flow diagram showing the procedure.

When an instruction to start the registration of the shape of the light outgoing ratio function is accepted from an operator, the acceptance part 801 causes the acceptance screen 9 to appear on the display part 87 (in Step S101).

After the acceptance screen 9 appears, the operator selects the shape type of the light outgoing ratio function from among the shape type candidates displayed in list form in the shape type selection area 91. The operator may select the stepped type, for example, if the nonuniformity of light exposure such that the amount of light exposure is varied greatly in a relatively small area in the boundary section occurs as a result of the light exposure in the case where the drawing process is performed in the default state under object processing conditions. The operator may select the trapezoidal type if the nonuniformity of light exposure such that the amount of light exposure is varied gradually in a relatively large area in the boundary section occurs as a result of the light exposure. Upon accepting the selection of the shape type from the operator (YES in Step S102), the acceptance part 801 subsequently accepts an input manipulation related to input items for the selected shape type.

When the stepped type is selected, the operator inputs the input items displayed in the input item area 92 for the stepped type. When the trapezoidal type is selected, the operator inputs the input items displayed in the input item area 93 for the trapezoidal type. Upon accepting the input of the input items from the operator (YES in Step S103), the acceptance part 801 causes the light outgoing ratio function defined from the inputted information to appear in the shape display area 94 (in Step S104).

In accordance with the state of the nonuniformity of light exposure occurring in the boundary section as a result of the light exposure in the case where the drawing process is performed in the default state, for example, under object processing conditions, the operator infers the shape of the light outgoing ratio function which can reduce the nonuniformity of light exposure as a target shape, and views the light outgoing ratio function appearing in the shape display area 94 to check whether the light outgoing ratio function has the target shape or not. Then, the operator corrects input values for the input items, as required. After verifying that the target shape is obtained, the operator manipulates the registration icon 95. Upon accepting the manipulation of the registration icon 95 from the operator (YES in Step S105), the acceptance part 801 provides the inputted information to the registration part 802.

Upon receiving the information from the acceptance part 801, the registration part 802 registers the information into the database D (in Step S106). Specifically, the registration part 802 registers the shape selected by the operator and the inputted information for the input items in association with the object processing conditions previously specified by the operator or the information for specifying the object processing conditions (e.g., a recipe number) into the database D. Thus, the information defining the shape of the single light outgoing ratio function is registered in association with the processing conditions of the drawing process. This information need not always be registered in the form of the database D, but may be registered, for example, by writing the information into a recipe for the object processing conditions.

<3. Operation of Drawing Apparatus 1>

The overall procedure for a substrate W in the drawing apparatus 1 will be described with reference to FIG. 16. FIG. 16 is a flow diagram showing the procedure. A series of operations to be described below are performed under the control of the controller 80.

Prior to the series of operations to be described below, the controller 80 reads a recipe including descriptions of the processing conditions from the storage device 84 and the like to adjust parameters for the components in accordance with the processing conditions specified in the recipe.

At this time, the controller 80 reads the information (i.e., the information defining the shape of the light outgoing ratio function) associated with the processing conditions specified in the recipe (or the recipe number of the recipe) from the database D stored in the storage device 84 and the like. When the information is written in the recipe, the controller 80 reads the information from the recipe. Then, the light outgoing ratio adjustment part 400 adjusts the light outgoing ratios of the group of modulation units 442 of the spatial light modulator 441 included in each of the two optical units 40 in accordance with the light outgoing ratio function defined from the information. Specifically, the light outgoing ratio adjustment part 400 adjusts the light outgoing ratios of the group of modulation units 442 of each of the spatial light modulators 441 so that the relationship between the position of the modulation units 442 as seen in the direction of the arrangement of the modulation units 442 and the light outgoing ratio coincides with the light outgoing ratio function defined from the information. When the registered shape type of the light outgoing ratio function is the stepped type or the trapezoidal type, the light amount distribution of the drawing light emitted from each of the spatial light modulators 441 as seen in the direction of the longer dimension of the strip-shaped cross section of the drawing light beam is adjusted to become a nonuniform state (i.e., so that an edge portion has a part with a smaller amount of light than the middle portion).

Thus, the light amount distribution of the drawing light emitted from each of the spatial light modulators 441 as seen in the direction of the longer dimension of the strip-shaped cross section of the drawing light beam is adjusted to a distribution which appropriately reduces the nonuniformity of light exposure under the processing conditions. In other words, the shape registration part 800 and the light outgoing ratio adjustment part 400 function as an adjustment part 100 (with reference to FIG. 11) for adjusting the light amount distribution of the drawing light as seen in the direction of the longer dimension of the strip-shaped cross section of the drawing light beam. After this adjustment, processes for a substrate W start.

First, the transport device 60 takes an unprocessed substrate W out of a cassette C placed on the cassette table 104, and transports the unprocessed substrate W into the drawing apparatus 1 (in Step S1).

Subsequently, the transport device 60 transports the transported substrate W into the prealignment part 70. The prealignment process is performed on the substrate W in the prealignment part 70 (in Step S2). The prealignment process is performed, for example, by detecting the position of the cutout of the substrate W placed on the table by means of the sensor, and then rotating the table so that the cutout is at a determined position. Thus, the substrate W placed on the table is roughly aligned with the determined rotational position.

Subsequently, the transport device 60 transports the substrate W subjected to the prealignment process out of the prealignment part 70 to place the substrate W on the stage 10 (in Step S3). After the substrate W is placed on the upper surface of the stage 10, the stage 10 holds the substrate W under suction.

After the substrate W is held on the stage 10 under suction, a precise alignment process (or fine alignment) is performed to place the substrate W in a proper position (in Step S4). Specifically, the stage drive mechanism 20 initially moves the stage 10 to a position lying under the imaging part 50. After the stage 10 is placed under the imaging part 50, the imaging part 50 then takes an image of the alignment mark on the substrate W to acquire the imaging data. Subsequently, the controller 80 performs an image analysis on the imaging data acquired by the imaging part 50 to detect the position of the alignment mark, thereby calculating the amount of deviation of the substrate W from the proper position, based on the detected position. After the calculation of the amount of deviation, the stage drive mechanism 20 moves the stage 10 through the calculated amount of deviation. This achieves the alignment so that the substrate W is placed in the proper position.

Figure 17:
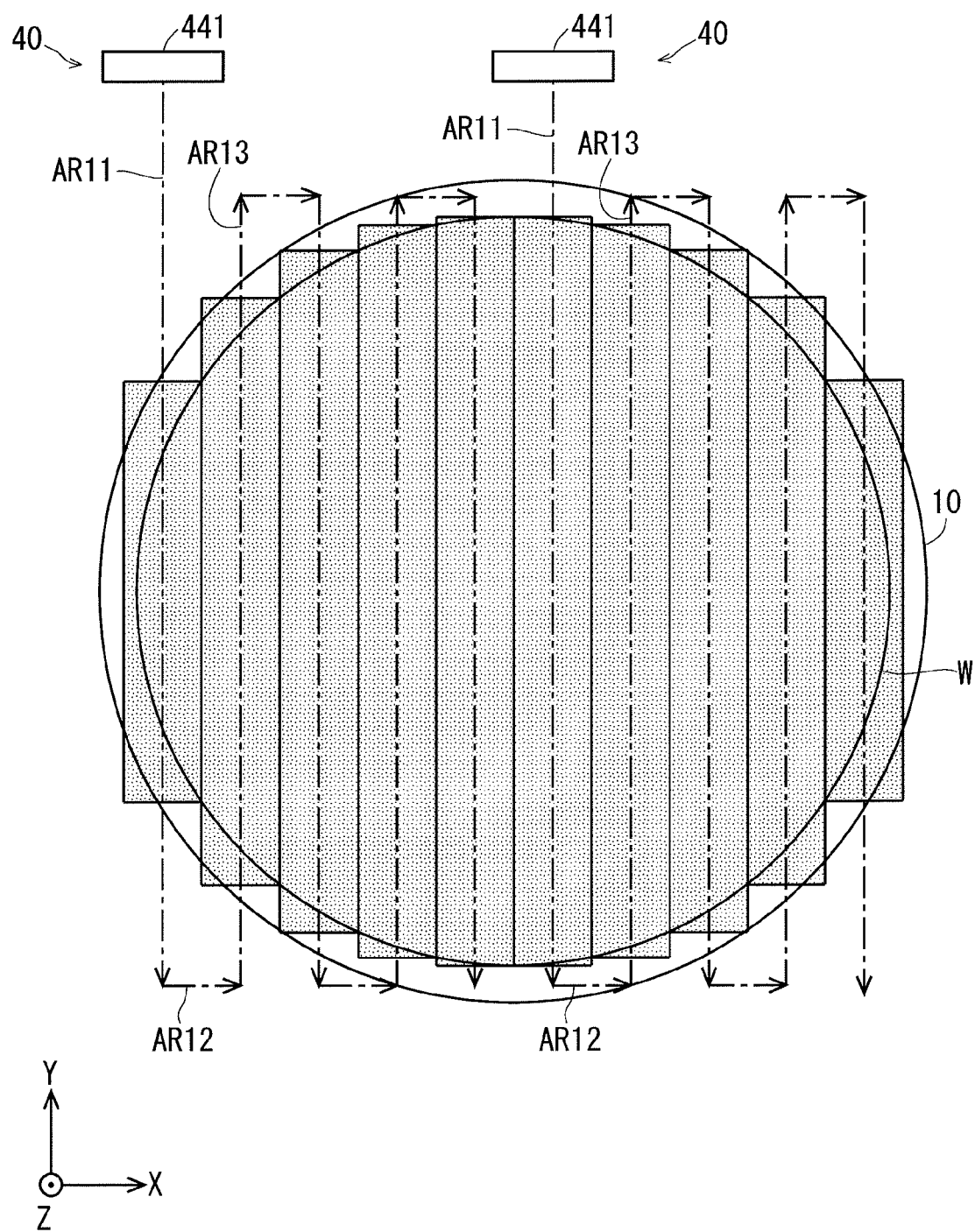
FIG. 17 is a view for illustrating a drawing process.

After the substrate W is placed in the proper position, the process of drawing patterns is performed (in Step S5). The drawing process will be described with reference to FIG. 17. FIG. 17 is a view for illustrating the drawing process.

The drawing process is performed under the control of the controller 80 by directing the spatially modulated light from each of the optical units 40 onto the upper surface of the substrate W while the stage drive mechanism 20 moves the substrate W placed on the stage 10 relative to the optical units 40.

Specifically, the stage drive mechanism 20 initially moves the stage 10 lying under the imaging part 50 in the positive Y direction along the main scanning direction (Y-axis direction) to thereby move the substrate W relative to the optical units 40 along the main scanning direction (which is referred to as main scanning). As viewed from the standpoint of the substrate W, the optical units 40 move across over the substrate W in the negative Y direction along the main scanning direction (as indicated by the arrows AR11). During the main scanning process, each of the optical units 40 continues to intermittently direct the drawing light subjected to the spatial modulation in accordance with the pattern data PD toward the substrate W (i.e., continues to project pulsed light repeatedly onto the surface of the substrate W). In other words, each of the optical units 40 moves across over the substrate W along the main scanning direction while continuing to intermittently direct the drawing light including the spatially modulated light corresponding to a plurality of pixels disposed along the sub-scanning direction. Thus, when each of the optical units 40 is moved across the substrate W once along the main scanning direction, a pattern group is drawn in a single strip-shaped region (a region extending along the main scanning direction and having a width along the sub-scanning direction which corresponds to the drawing width M). In this preferred embodiment, pattern groups are drawn in two strip-shaped regions, respectively, by the single main scanning process because the two optical units 40 are moved across the substrate W at the same time.

After the single main scanning process is completed, the stage drive mechanism 20 moves the stage 10 a determined distance in the negative X direction along the sub-scanning direction (the X-axis direction) to thereby move the substrate W relative to the optical units 40 along the sub-scanning direction (which is referred to as the sub-scanning process). As viewed from the standpoint of the substrate W, the optical units 40 move the determined distance in the positive X direction along the sub-scanning direction (as indicated by the arrows AR12).

Upon completion of the sub-scanning process, a main scanning process is performed again. Specifically, the stage drive mechanism 20 moves the stage 10 in the negative Y direction along the main scanning direction to thereby move the substrate W relative to the optical units 40 along the main scanning direction. As viewed from the standpoint of the substrate W, the optical units 40 move across over the substrate W in the positive Y direction along the main scanning direction (as indicated by the arrows AR13) through a region adjacent to the strip-shaped region subjected to the pattern drawing by the preceding main scanning process. Also in this stage, each of the optical units 40 moves across over the substrate W along the main scanning direction while continuing to intermittently direct the drawing light subjected to the spatial modulation in accordance with the pattern data PD toward the substrate W. Thus, a pattern group is drawn in another strip-shaped region adjacent to the strip-shaped region subjected to the pattern drawing by the preceding main scanning process. As mentioned above, when the effective width d in the light outgoing ratio function is equal to with the reference width T, an edge of each strip-shaped region is adjacent to and in intimate contact with the strip-shaped region subjected to the pattern drawing by the preceding main scanning process (with reference to FIG. 5). When the effective width d in the light outgoing ratio function is greater than the reference width T, an edge of each strip-shaped region overlaps the strip-shaped region subjected to the pattern drawing by the preceding main scanning process (with reference to FIGS. 7 and 10).

Thereafter, the main and sub-scanning processes are similarly performed in a repeated manner until the patterns are drawn in the entire region to be subjected to the pattern drawing. Then, the drawing process is completed.

Reference is made again to FIG. 16. After the drawing process is completed, the transport device 60 transports the processed substrate W out of the drawing apparatus 1 (in Step S6). This completes the series of processes performed on the substrate W.

<4. Effects>

According to the aforementioned preferred embodiment, the simple selection manipulation for selecting the shape type of the light outgoing ratio function from among the plurality of shape type candidates achieves the adjustment of the light outgoing ratio of each of the modulation units 442 so that the distribution of the light outgoing ratios of the group of modulation units 442 coincides with the light outgoing ratio function of the selected shape type. This makes the adjustment of the light amount distribution of the drawing light as seen in the direction of the longer dimension of the strip-shaped cross section of the drawing light beam. This allows an operator to easily perform the adjustment operation for reducing the nonuniformity of light exposure in the boundary section.

In particular, the stepped type is included in the plurality of shape type candidates in the aforementioned preferred embodiment. For example, when the nonuniformity of light exposure occurs in such a manner that the amount of light exposure is varied relatively greatly in a relatively small area in the boundary section, the selection of the stepped type as the shape type of the light outgoing ratio function effectively reduces the nonuniformity of light exposure. Thus, when such nonuniformity of light exposure occurs, an operator may select the stepped type as the shape type of the light outgoing ratio function to effectively reduce the nonuniformity of light exposure.

In particular, the trapezoidal type is included in the plurality of shape type candidates in the aforementioned preferred embodiment. For example, when the nonuniformity of light exposure occurs in such a manner that the amount of light exposure is varied relatively gradually in a relatively large area in the boundary section, the selection of the trapezoidal type as the shape type of the light outgoing ratio function effectively reduces the nonuniformity of light exposure. Thus, when such nonuniformity of light exposure occurs, an operator may select the trapezoidal type as the shape type of the light outgoing ratio function to effectively reduce the nonuniformity of light exposure.

According to the aforementioned preferred embodiment, an operator is allowed to specify the input items for each of the shape types of the light outgoing ratio function. Thus, a fine adjustment is made to the shape of the light outgoing ratio function to appropriately reduce the nonuniformity of light exposure. Specifically, when the stepped type is selected as the shape type of the light outgoing ratio function, the operator is allowed to further specify the width of the changed portion. This achieves, for example, the fine adjustment of the width of the overlap to appropriately reduce the nonuniformity of light exposure. When the stepped type is selected as the shape type of the light outgoing ratio function, the operator is allowed to further specify the light outgoing ratio in the changed portion. This achieves, for example, the fine adjustment of the amount of drawing light in the overlap to appropriately reduce the nonuniformity of light exposure. When the trapezoidal type is selected as the shape type of the light outgoing ratio function, the operator is allowed to further specify the light outgoing ratio in each representative position. This achieves, for example, the fine adjustment of the amount of drawing light in the overlap to appropriately reduce the nonuniformity of light exposure.

According to the aforementioned preferred embodiment, the acceptance screen 9 displaying the plurality of shape type candidates in list form appears, and the selection manipulation is accepted via the acceptance screen 9. This allows the operator to especially easily perform the selection manipulation for selecting any one of the plurality of shape type candidates.

According to the aforementioned preferred embodiment, the information accepted from an operator by the acceptance part 801 is registered in association with the processing conditions of the drawing process. Thus, the operator need not perform the selection manipulation for selecting the shape type of the light outgoing ratio function again for the same processing conditions, but the light amount distribution of the drawing light as seen in the direction of the longer dimension of the strip-shaped cross section of the drawing light beam is adjusted to an appropriate shape which reduces the nonuniformity of light exposure in the boundary section.

<5. Modifications>

Figure 18:
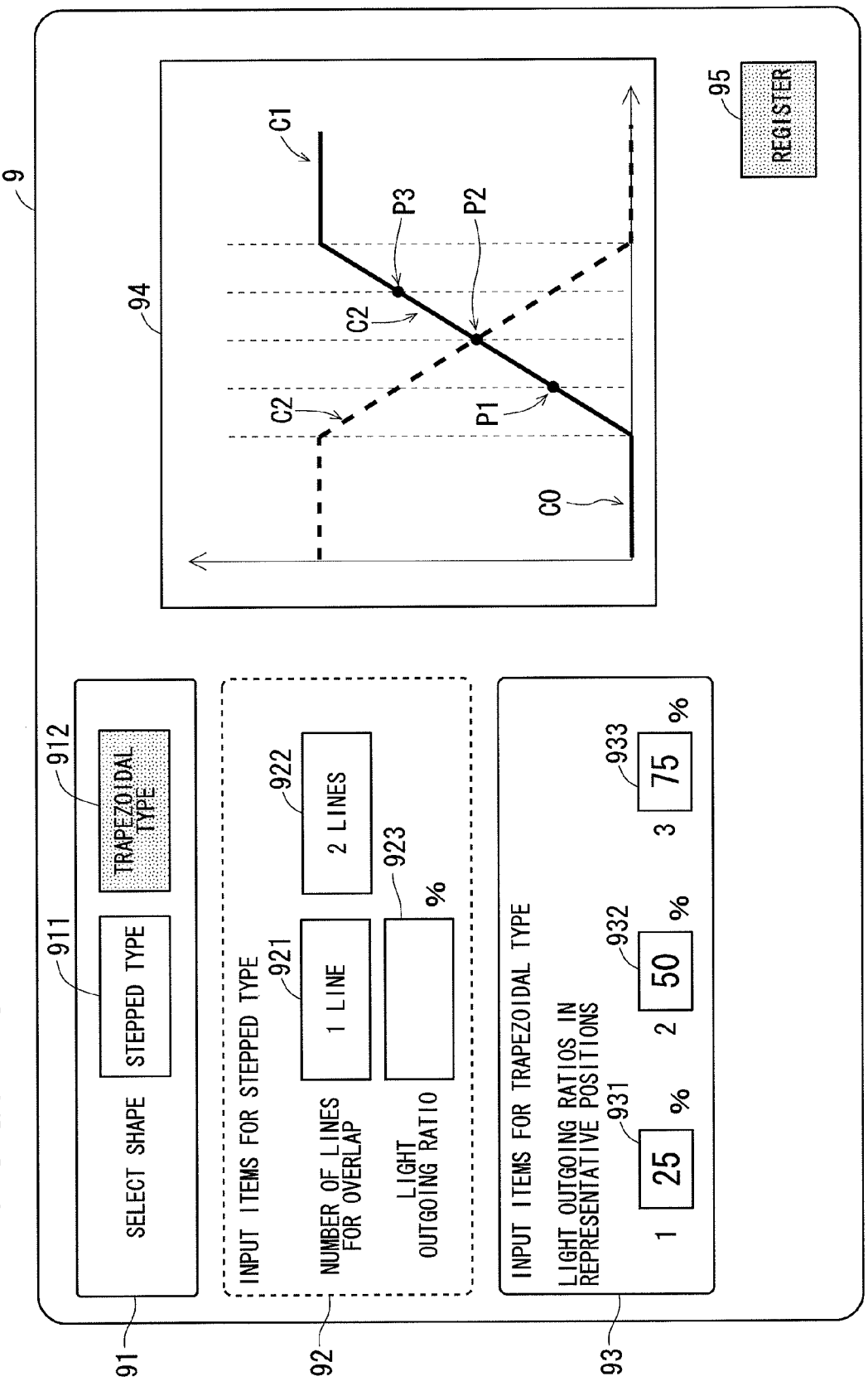
FIG. 18 is a view schematically showing an example of the configuration of the acceptance screen according to a modification.

When the shape type of the light outgoing ratio function is the trapezoidal type in the aforementioned preferred embodiment, some of the modulation units 442 disposed in one of the changed portions C2 on opposite sides of the mid-portion C1 are responsible for the light exposure of a lower layer portion of the overlap of strip-shaped regions, and some of the modulation units 442 disposed in the other changed portion C2 are responsible for the light exposure of an upper layer portion of the overlap, as mentioned above. As illustrated in FIG. 18, when the trapezoidal type is selected as the shape type of the light outgoing ratio function on the acceptance screen 9, one of the changed portions C2 (indicated by solid lines) may be displayed so as to overlap the other changed portion C2 (indicated by broken lines) on the shape display area 94. Also, a function obtained by adding the two changed portions C2 together may be further displayed. In these configurations, an operator can intuitively grasp the amount of light provided to the overlap of the strip-shaped regions to appropriately determine the proper value of the light outgoing ratio in each representative position (i.e., the form of change of the changed portions C2).

The input items related to the light outgoing ratio function of the stepped type and the input items related to the light outgoing ratio function of the trapezoidal type according to the aforementioned preferred embodiment are not necessarily limited to those described above. For example, the width d2 of the changed portions C2 may be used as an input item related to the light outgoing ratio function of the trapezoidal type in addition to (or in place of) the light outgoing ratios in the representative positions. The representative positions need not always be fixed in positions where each of the changed portions C2 is divided into equal parts, but an item for accepting the specification of a representative position may be added as an input item. Also, the acceptance screen 9 may be configured to allow an operator to arbitrarily specify the number of representative positions.

The input items need not always be provided. The acceptance screen 9 may be configured to accept only the selection manipulation of the shape type.

The stepped type and the trapezoidal type are illustrated as the shape type candidates in the aforementioned preferred embodiment. However, another shape type (for example, a shape type of normal distribution) may be included in addition to (or in place of) the stepped and trapezoidal types.

The light outgoing ratio adjustment part 400 preferably performs a calibration on the group of modulation units 442 included in each of the spatial light modulators 441 at a predetermined time to ensure the attainment of an intended light outgoing ratio of each of the modulation units 442. Preferably, examples of the time at which the calibration is performed include the time at which the processing conditions are changed, the time at which a predetermined number of substrates W are processed after the preceding calibration, and the time at which a predetermined length of time has elapsed since the preceding calibration.

In the aforementioned preferred embodiment, the spatial light modulator of a diffraction grating type is used as each of the spatial light modulators 441. However, a spatial light modulator in which modulation units such as mirrors are arranged one-dimensionally, for example, may be used as each of the spatial light modulators 441.

While the invention has been described in detail, the foregoing description is in all aspects illustrative and not restrictive. It is understood that numerous other modifications and variations can be devised without departing from the scope of the invention.

What is claimed is:

1. A method of directing light onto a substrate with a photosensitive material formed thereon to draw a pattern on the substrate, the method comprising the steps of:
   a) moving an optical unit relative to the substrate in a first direction while emitting a beam of drawing light of a strip-shaped cross-sectional configuration from the optical unit, the first direction being orthogonal to a second direction which is the direction of the longer dimension of the strip-shaped cross section of the drawing light beam; and b) adjusting a distribution of the amount of drawing light as seen in the second direction, the step a) including the substeps of
a1) emitting a beam of light of a strip-shaped cross-sectional configuration from a light source part, and
a2) causing the light beam emitted from the light source part to enter a plurality of modulation units arranged in a line in such a manner that the longer dimension of the strip-shaped cross section of the light beam is along the arrangement of the modulation units, and causing the modulation units to modulate the incident light beam, thereby forming the drawing light beam,
the step b) including the substeps of
b1) accepting a selection manipulation for selecting the type of shape of a light outgoing ratio function from among a plurality of shape type candidates, the light outgoing ratio function being a function defining a relationship between the position of the modulation units as seen in the direction of the arrangement of the modulation units and a light outgoing ratio, the light outgoing ratio being a ratio of the amount of outgoing light to the amount of light incident on the modulation units, and
b2) adjusting the light outgoing ratio of each of the modulation units in accordance with the shape type accepted in the substep b1);
wherein
the plurality of shape type candidates include at least a trapezoidal type; and
the trapezoidal type includes a mid-portion where the light outgoing ratio is constant, and a changed portion where the light outgoing ratio is changed in inclined form, the changed portion being continuous with the mid-portion.

2. The method according to claim 1, wherein:
the shape type candidates include a stepped type; and
the stepped type includes a mid-portion where the light outgoing ratio is constant, and a changed portion where the light outgoing ratio is changed in stepped form, the changed portion being continuous with the mid-portion.

3. The method according to claim 2, wherein
the step b) further includes the substep of
accepting the specification of the width of the changed portion when the stepped type is selected in the substep b1).

4. The method according to claim 2, wherein
the step b) further includes the substep of
accepting the specification of the light outgoing ratio of the changed portion when the stepped type is selected in the substep b1).

5. The method according to claim 1, wherein
the step b) further includes the substep of
accepting the specification of the light outgoing ratio in one or each representative position within the changed portion when the trapezoidal type is selected in the substep b1).

6. The method according to claim 1, wherein
an acceptance screen displaying the shape type candidates in list form is caused to appear on a determined display device, and the selection manipulation is accepted via the acceptance screen in the substep b1).

7. The method according to claim 1, further comprising the step of:
c) registering information accepted in the step b) in association with a processing condition of a process of drawing a pattern on the substrate.

* * * * *